(12) United States Patent
Wang et al.

(10) Patent No.: US 12,507,480 B2
(45) Date of Patent: Dec. 23, 2025

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xinxin Wang, Beijing (CN); Zhiwen Chu, Beijing (CN); Yi Qu, Beijing (CN); Lu Bai, Beijing (CN); Yixuan Long, Beijing (CN); Lei He, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 486 days.

(21) Appl. No.: 18/023,425

(22) PCT Filed: Feb. 24, 2022

(86) PCT No.: PCT/CN2022/077719
§ 371 (c)(1),
(2) Date: Feb. 27, 2023

(87) PCT Pub. No.: WO2023/159430
PCT Pub. Date: Aug. 31, 2023

(65) Prior Publication Data
US 2024/0274620 A1  Aug. 15, 2024

(51) Int. Cl.
*H10D 86/60* (2025.01)
*H10D 86/40* (2025.01)

(52) U.S. Cl.
CPC ........... *H10D 86/60* (2025.01); *H10D 86/443* (2025.01)

(58) Field of Classification Search
CPC ...... H10D 86/60; H10D 86/443; H10D 86/00; G02F 1/1362
See application file for complete search history.

(56) References Cited

U.S. PATENT DOCUMENTS

| 10,692,438 B2 * | 6/2020 | Yang .................... H10D 86/441 |
| 2003/0086048 A1 * | 5/2003 | Ukita .................... G02F 1/1345 |
| | | 349/149 |

(Continued)

FOREIGN PATENT DOCUMENTS

| CN | 1674735 A | 9/2005 |
| CN | 102323681 A | 1/2012 |

(Continued)

*Primary Examiner* — Pegeman Karimi
(74) *Attorney, Agent, or Firm* — WHDA, LLP

(57) ABSTRACT

A display substrate and a display device are provided. The display substrate includes: a base substrate, a display area, and a frame area arranged on a first side of the display area; the display area includes a central display area, a first display area and a second display area; the display substrate includes a plurality of first data lines, a plurality of second data lines; the first data signal lead includes a first lead portion extending along a first direction, and the second data signal lead includes a second lead portion extending along a second direction; a line width of the first lead portion is smaller than a line width of the second lead portion; the extension direction of the first data line and the extension direction of the second data line are a third direction.

20 Claims, 13 Drawing Sheets

(56) References Cited

U.S. PATENT DOCUMENTS

| | | | |
|---|---|---|---|
| 2005/0127830 A1 | 6/2005 | Heo et al. | |
| 2010/0225624 A1* | 9/2010 | Fu | G09G 3/20 345/205 |
| 2012/0319623 A1 | 12/2012 | Cheng et al. | |
| 2016/0155754 A1* | 6/2016 | Tezuka | H10D 86/441 257/91 |
| 2018/0240816 A1 | 8/2018 | Kian et al. | |
| 2022/0082878 A1 | 3/2022 | Liu | |

FOREIGN PATENT DOCUMENTS

| | | |
|---|---|---|
| CN | 104952888 A | 9/2015 |
| CN | 103337233 B | 3/2016 |
| CN | 206020893 U | 3/2017 |
| CN | 106990630 A | 7/2017 |
| CN | 109658891 B | 8/2020 |
| CN | 113540193 A | 10/2021 |

* cited by examiner

DISPLAY SUBSTRATE AND DISPLAY DEVICE

CROSS-REFERENCE TO RELATED APPLICATION

This application is the U.S. national phase of PCT Application No. PCT/CN2022/077719 filed on Feb. 24, 2022, which is incorporated herein by reference in its entirety.

TECHNICAL FIELD

The present disclosure relates to the field of display technology, in particular to a display substrate and a display device.

BACKGROUND

With the continuous development of flexible screen technology, mobile phones with folding screens continue to enter into the market. Compared as conventional mobile phones, mobile phones with folding screens have stricter screen quality and display effects, especially the improvement of screen display uniformity in low gray scale is more important. The line resistance of the signal line used to transmit the data voltage is an important factor affecting the uniformity of the low gray scale. The driving current Ioled is equal to $K(VDD-Vdata)^2$, wherein K is the current coefficient of the driving transistor, and the first voltage VDD is a constant, and the voltage value Vdata of the data voltage decreases as the line resistance of the signal line increases. The smaller the line resistance difference between the various signal lines is, the better the low gray level uniformity is. Therefore, in order to improve display uniformity, it is necessary to perform resistance compensation on the signal lines.

SUMMARY

In one aspect, the present disclosure provides in some embodiments a display substrate, including a display area, and a frame area arranged on a first side of the display area; wherein the display area includes a central display area, a first display area arranged on a second side of the central display area, and a second display area arranged on a third side of the central display area; the second side is opposite to the third side; the display substrate includes a plurality of first data lines arranged in the central display area, a plurality of second data lines arranged in the first display area and the second display area, and a plurality of first data signal leads and a plurality of second data signal leads arranged in the frame area; the first data signal lead is coupled to the first data line, and the second data signal lead is coupled to the second data line; the first data signal lead includes a first lead portion extending along a first direction, and the second data signal lead includes a second lead portion extending along a second direction; a line width of the first lead portion is smaller than a line width of the second lead portion; an extension direction of the first data line and an extension direction of the second data line are a third direction, the first direction intersects the third direction, and the second direction intersects the third direction; there is a first angle between the first direction and the third direction, and there is a second angle between the second direction and the third direction.

Optionally, the line width of the first lead portion is greater than or equal to 1.0 um and less than or equal to 2.0 um, and the line width of the second lead portion is greater than or equal to 1.5 um and less than or equal to 3.0 um; the second data signal lead further includes a third lead portion extending along a fourth direction; a line width of the third lead portion is greater than the line width of the second lead portion.

Optionally, the line width of the third lead portion is greater than or equal to 1.8 um and less than or equal to 4.0 um; the second data signal lead includes a fourth lead portion extending along a third direction; a line width of the fourth lead portion is greater than the line width of the second lead portion.

Optionally, the line width of the fourth lead portion is greater than or equal to 3 um and less than or equal to 13 um; the frame area includes a first fan-out area and a second fan-out area arranged along a direction away from the display area; a line width of the second lead portion in the first fan-out area is smaller than a line width of the second lead portion in the second fan-out area.

Optionally, the frame area comprises a first fan-out area and a second fan-out area arranged in a direction away from the display area; and the first data signal lead include a serpentine lead portion; the serpentine lead portion includes a plurality of first lead portions extending along a third direction, and a plurality of second lead portions extending along a fifth direction; the first lead portions and the second lead portions are arranged alternately, adjacent first lead portion and the second lead portion are coupled to each other.

Optionally, a shortest distance between two adjacent second lead portions included in a same serpentine lead portion is greater than or equal to 2.4 um and less than or equal to 3 um; a shortest distance between adjacent two serpentine lead portions is greater than or equal to 1.0 um and less than or equal to 2 um, and the line width of the first lead portion and the line width of the second lead portion are both greater than or equal to 1.8 um and less than or equal to 2.4 um.

Optionally, the frame area includes a first fan-out area and a second fan-out area arranged along a direction away from the display area; in the first fan-out area, a sum of the line width of the first lead portion and a shortest distance between two adjacent first lead portions is equal to a sum of the line width of the second lead portion and a shortest distance between two adjacent second lead portions; in the second fan-out area, the sum of the line width of the first lead portion and the shortest distance between two adjacent first lead portions is equal to the sum of the line width of the second lead portion and the shortest distance between two adjacent second lead portions.

Optionally, the shortest distance between two adjacent first lead portions is greater than or equal to 1.0 um and less than or equal to 2.0 um; the shortest distance between two adjacent second lead portions is greater than or equal to 0.5 um and less than or equal to 1.0 um.

Optionally, the first angle is greater than 0 degrees and less than 89.5 degrees, or greater than 90.5 degrees and less than 180 degrees, and the second angle is greater than 0 degrees and less than 89.5 degrees, or greater than 90.5 degrees and less than 180 degrees.

Optionally, the frame area comprises a fan-out area, the fan-out area includes a first fan-out area and a second fan-out area arranged in a direction away from the display area; the display substrate includes a base substrate, and a first metal layer and a second metal layer stacked along a direction away from the base substrate; a lead portion included in the first data signal lead and arranged in the fan-out area is included in the first metal layer or the second metal layer; a lead portion included in the second data signal lead and arranged in the fan-out area is included in the first metal layer or the second metal layer; lead portions included in adjacent data signal leads and arranged in the fan-out area are included in different layers.

Optionally, the frame area further comprises a bending area arranged between the first fan-out area and the second fan-out area, and the display substrate further comprises a source-drain metal layer; the data signal lead also includes a fifth lead portion arranged in the bending area; the fifth lead portion is included in the source-drain metal layer.

Optionally, the display substrate comprises a first source-drain metal layer and a second source-drain metal layer, and on a side of the second metal layer away from the base substrate, the first source-drain metal layer and the second source-drain metal layer are sequentially stacked in a direction away from the base substrate; the fifth lead portion is included in at least one of the first source-drain metal layer and the second source-drain metal layer.

Optionally, the display substrate comprises a first source-drain metal layer, a second source-drain metal layer and an additional source-drain metal layer; the fifth lead portion is included in at least one of the first source-drain metal layer, the second source-drain metal layer, and the additional source-drain metal layer; on a side of the second metal layer away from the base substrate, the first source-drain metal layer, the second source-drain metal layer and the additional source-drain metal layer are sequentially stacked along a direction away from the base substrate; or, on the side of the second metal layer away from the base substrate, the additional source-drain metal layer, the first source-drain metal layer and the second source-drain metal layer are sequentially stacked in the direction away from the base substrate; or, the base substrate includes a first base substrate and a second base substrate that are stacked, and the additional source-drain metal layer is arranged between the first base substrate and the second base substrate, the first source-drain metal layer and the second source-drain metal layer are sequentially stacked on the side of the second metal layer away from the base substrate.

Optionally, the fan-out area further includes a third fan-out area, and the frame area further includes an electrostatic protection area and a cell-forming test area; the second fan-out area, the electrostatic protection area, the cell-forming test area and the third fan-out area are arranged in sequence along a direction away from the display area; a lead portion included in the first data signal lead and arranged in the electrostatic protection area and the cell-forming test area is arranged in a same layer as a lead portion included in the first data signal lead and arranged in the fan-out area; a lead portion included in the second data signal lead and arranged in the electrostatic protection area and the cell-forming test area is arranged in a same layer as a lead portion included in the second data signal lead and arranged in the fan-out area.

In a second aspect, an embodiment of the present disclosure provides a display device, including the display substrate.

DETAILED DESCRIPTION

Figure 1:
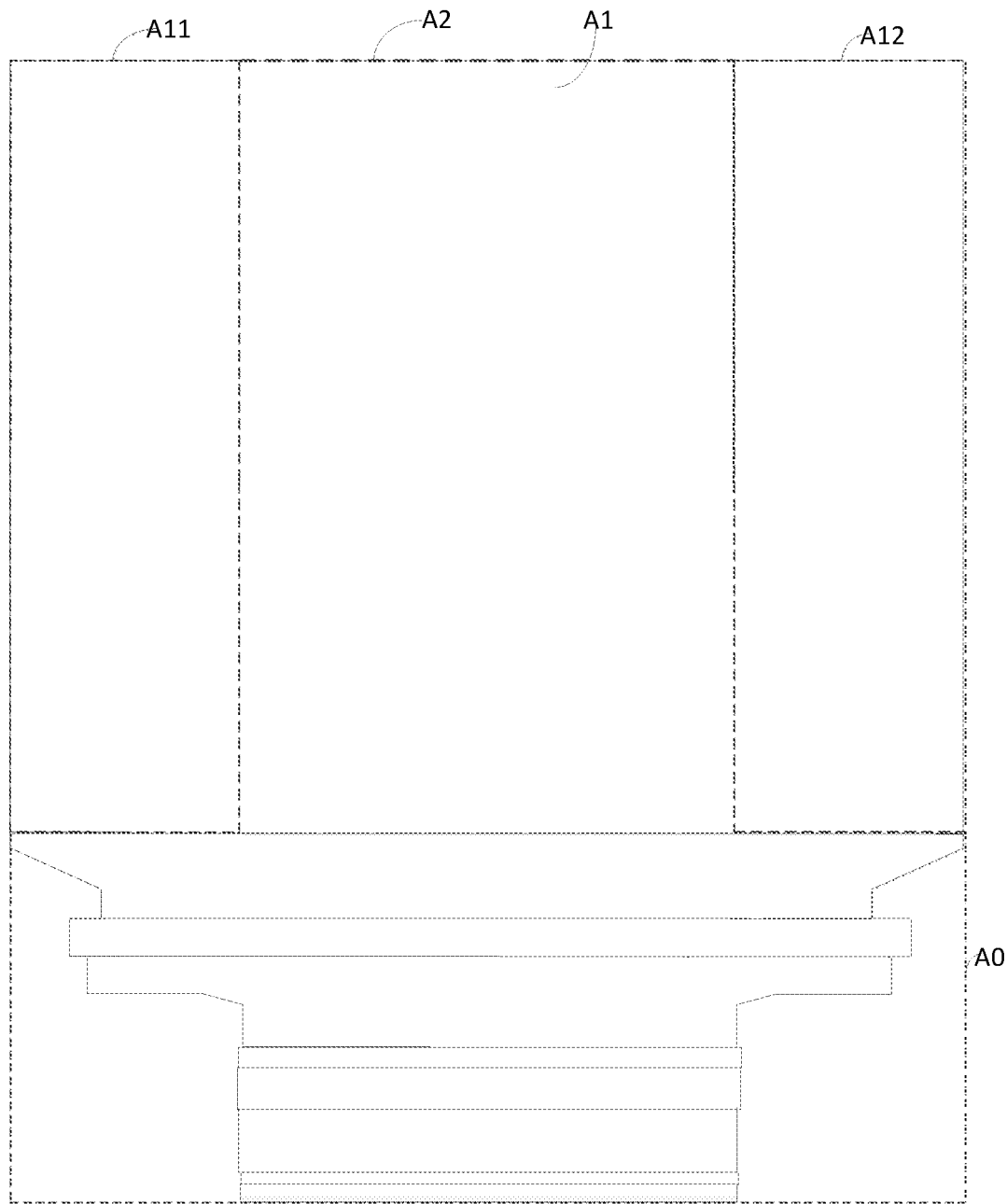
FIG. 1 is a schematic diagram of area division of a display substrate according to at least one embodiment of the present disclosure.

The following will clearly and completely describe the technical solutions in the embodiments of the present disclosure with reference to the accompanying drawings in the embodiments of the present disclosure. Apparently, the described embodiments are only some of the embodiments of the present disclosure, not all of them. Based on the embodiments in the present disclosure, all other embodiments obtained by a person skilled in the art without making creative work belong to the protection scope of the present disclosure.

The display substrate described in the embodiment of the present disclosure includes a display area, and a frame area arranged on a first side of the display area;

The display area includes a central display area, a first display area arranged on a second side of the central display area, and a second display area arranged on a third side of the central display area; the second side is opposite to the third side;

The display substrate includes a plurality of first data lines arranged in the central display area, a plurality of second data lines arranged in the first display area and the second display area, and a plurality of first data signal leads and a plurality of second data signal leads arranged in the frame area; the first data signal lead is coupled to the first data line, and the second data signal lead is coupled to the second data line;

The first data signal lead includes a first lead portion extending along a first direction, and the second data signal lead includes a second lead portion extending along a second direction;

A line width of the first lead portion is smaller than a line width of the second lead portion;

The extension direction of the first data line and the extension direction of the second data line are a third direction, the first direction intersects the third direction, and the second direction intersects the third direction;

There is a first angle between the first direction and the third direction, and a second angle between the second direction and the third direction.

In at least one embodiment of the present disclosure, the first angle is greater than 0 degrees and less than 89.5 degrees or greater than 90.5 degrees and less than 180 degrees, and the second angle is greater than 0 degrees and less than 89.5 degrees or greater than 90.5 degrees and less than 180 degree.

Optionally, the third direction may be a vertical direction, but not limited thereto.

In at least one embodiment of the present disclosure, the line width of each signal line may refer to: a width of the signal line along the line width direction; the line width direction is a direction perpendicular to the extending direction of the signal line.

In at least one embodiment of the present disclosure, the first direction is not perpendicular to the third direction, the first direction is not substantially perpendicular to the third direction, and the second direction is not perpendicular to the third direction, the second direction is not substantially perpendicular to the third direction.

In at least one embodiment of the present disclosure, the first direction is substantially perpendicular to the third direction means: the first angle is greater than or equal to 89.5 degrees and less than or equal to 90.5 degrees, and the first angle is not equal to 90 degrees;

The first direction intersects the third direction, the first direction is not perpendicular to the third direction, and the first direction is not substantially perpendicular to the third direction means: the first angle is greater than 0 degrees and less than 89.5 degrees or greater than 90.5 degrees and less than 180 degrees;

The second direction is substantially perpendicular to the third direction means: the second angle is greater than or equal to 89.5 degrees and less than or equal to 90.5 degrees, and the second angle is not equal to 90 degrees;

The second direction intersects the third direction, the second direction is not perpendicular to the third direction, and the second direction is not substantially perpendicular to the third direction means: the second angle is greater than 0 degrees and less than 89.5 degrees or greater than 90.5 degrees and less than 180 degrees;

But not limited to this.

In specific implementation, the first data line and the second data line may be vertically extended data lines, and the first lead portion and the second lead portion may be oblique lead portions. In the at least one embodiment of the present disclosure, the line width of the first lead portion coupled to the first data line located in the central display area is set to be smaller than the line width of the second lead portion coupled to the second data line located in the display areas on both sides, so as to improve the poor display uniformity caused by the excessive difference in line resistance between the data signal leads, so that the line width of the second lead portion is larger, the resistance value of the second data signal lead becomes smaller, the line width of the first lead portion is smaller, so that the resistance value of the first data signal lead becomes larger, so that the difference between the line resistance values of data signal leads becomes smaller, the color shift phenomenon is improved, and the display uniformity is improved, which can ensure display uniformity in low grayscale.

In the related art, the line resistance of the signal line for transmitting the data voltage is an important factor affecting the uniformity of the low gray scale. The smaller the line resistance difference between the signal lines for transmitting data voltages is, the closer the written data voltages are, and thus the closer the light emitting currents of the light emitting elements are, and the better the low gray scale uniformity is. In the embodiment of the present disclosure, the difference between the line resistance values of the data signal leads can be reduced by setting the line widths of the lead portions arranged obliquely. By adopting the display substrate described in the embodiment of the present disclosure, Rmax/Rmin can be reduced to below 2.0, where Rmax is the maximum value of the resistance values of the data signal leads, and Rmin is the minimum value of the resistance values of the data signal leads.

In at least one embodiment of the present disclosure, the first side may be a lower side, the second side may be a left side, and the third side may be a right side, but not limited thereto.

Figure 2:
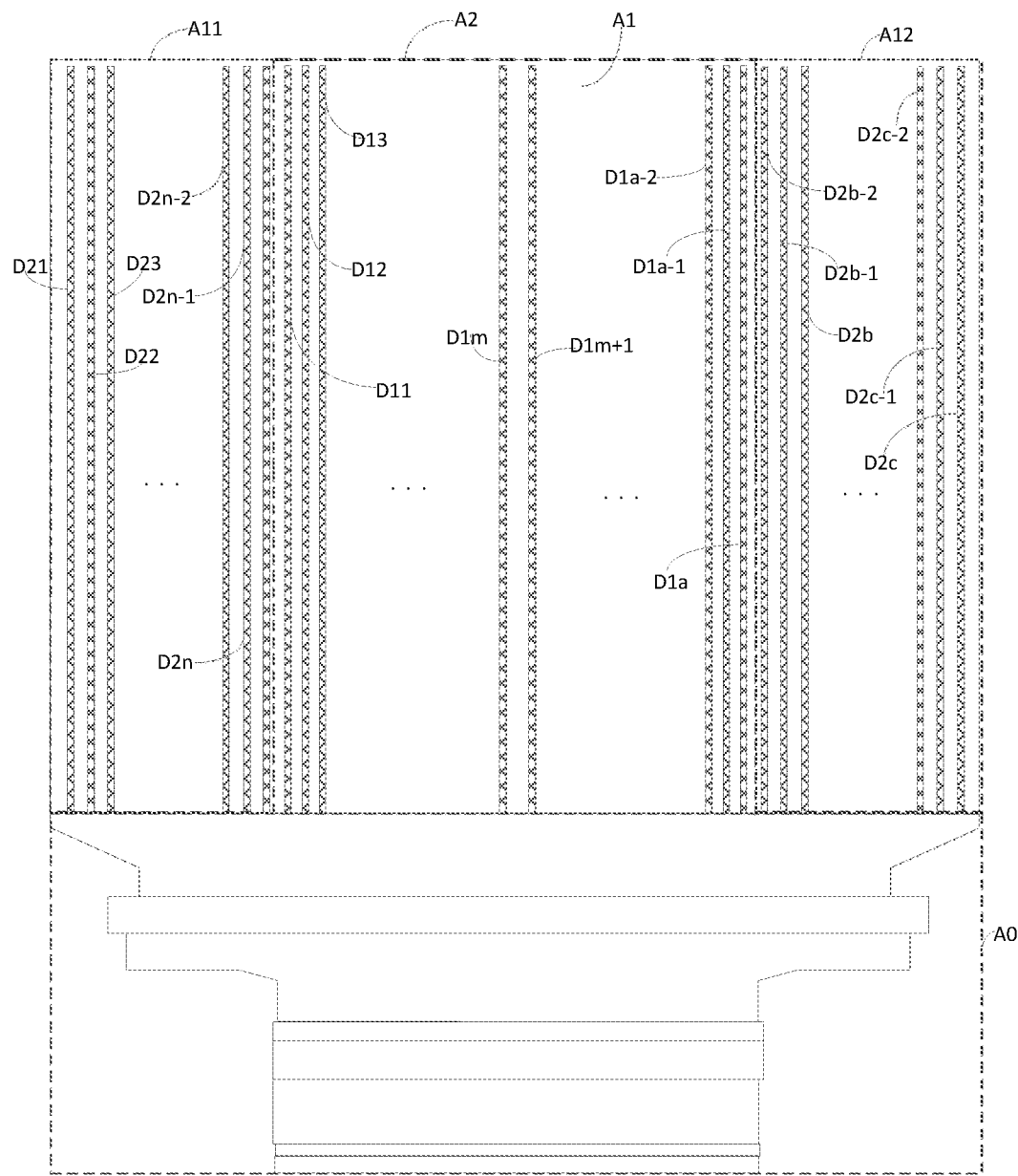
FIG. 2 is a schematic diagram of adding a plurality of columns of data lines on the basis of FIG. 1.

As shown in FIG. 1, the display substrate according to at least one embodiment of the present disclosure includes a display area A1, and a frame area A0 arranged on the lower side of the display area A1;

The display area A1 includes a central display area A2, a first display area A11 arranged on the left side of the central display area A2, and a second display area A12 arranged on the right side of the central display area A2;

As shown in FIG. 2, the display substrate includes a plurality of first data lines arranged in the central display area A2, a plurality of second data lines arranged in the first display area A11 and the second display area A12, and a plurality of first data signal leads and a plurality of second data signal leads arranged in the frame area A0;

In FIG. 2, the one marked D21 is the second data line in the first column arranged in the first display area A11, and the one marked D22 is the second data line in the second column arranged in the first display area A11, the one labeled D23 is the second data line in the third column arranged in the first display area A11;

The one labeled D2$n$–2 is the second data line in the (n–2)th column arranged in the first display area A11, and the one labeled D2$n$–1 is the second data line in the (n–1)th column arranged in the first display area A11, the one labeled D2$n$ is the second data line in the nth column arranged in the first display area A11; n is a positive integer, and n is greater than 5;

The one marked D11 is the first data line in the first column arranged in the central display area A2, the one marked D12 is the first data line in the second column arranged in the central display area A2, and the one marked D13 is the first data line in the third column arranged in the central display area A2;

The one marked D1$m$ is the first data line in the mth column arranged in the central display area A2, the one marked Dm+1 is the first data line in the (m+1)th column arranged in the central display area A2, and m is a positive integer, m is greater than 3;

The one labeled D1$a$–2 is the first data line in the (a–2)th column arranged in the central display area A2, and the one labeled D1$a$–1 is the first data line in the (a–1)th column arranged in the central display area A2 line, the one labeled D1$a$ is the first data line in the ath column arranged in the central display area A2; a is a positive integer, and a–2 is greater than m+1; the one labeled D2$b$–2 is the second data line in the (b–2)th column arranged the display area A12, the one marked D2$b$–1 is the second data line in the (b–1)th column arranged in the second display area A12, and the ones marked D2$b$ is the second data line in bth column arranged in the second display area A12; b is a positive integer, and b–2 is equal to n+1;

The one labeled D2$c$–2 is the second data line in the (c–2)th column arranged in the second display area A12, and the one labeled D2$c$–1 is the second data line in the (c–1)th column arranged in the second display area A12, the one labeled D2$c$ is the second data line in cth column arranged in the second display area A12; c is a positive integer, and c is greater than b+2.

In FIG. 2, in the first display area A11 and the second display area A12, a plurality of columns of second data lines are provided, and each column of second data lines is labeled from left to right;

The second data line D2$n$ in the nth column is the rightmost second data line in the first display area A11, and the second data line D2$b$–2 in the (b–2)th column is the leftmost second data line in the second display area A12, the second data line D2$b$–2 in (b–2)th column is the second data line in (n+1)th column, that is, b–2 is equal to n+1;

The second data line D2$c$–2 in the (c–2)th column is located on the right side of the second data line D2$b$ in the bth column, therefore, c–2 is greater than b, and c is greater than b+2.

As shown in FIG. 2, in at least one embodiment of the present disclosure, the third direction may be a vertical direction, but not limited thereto.

Figure 3:
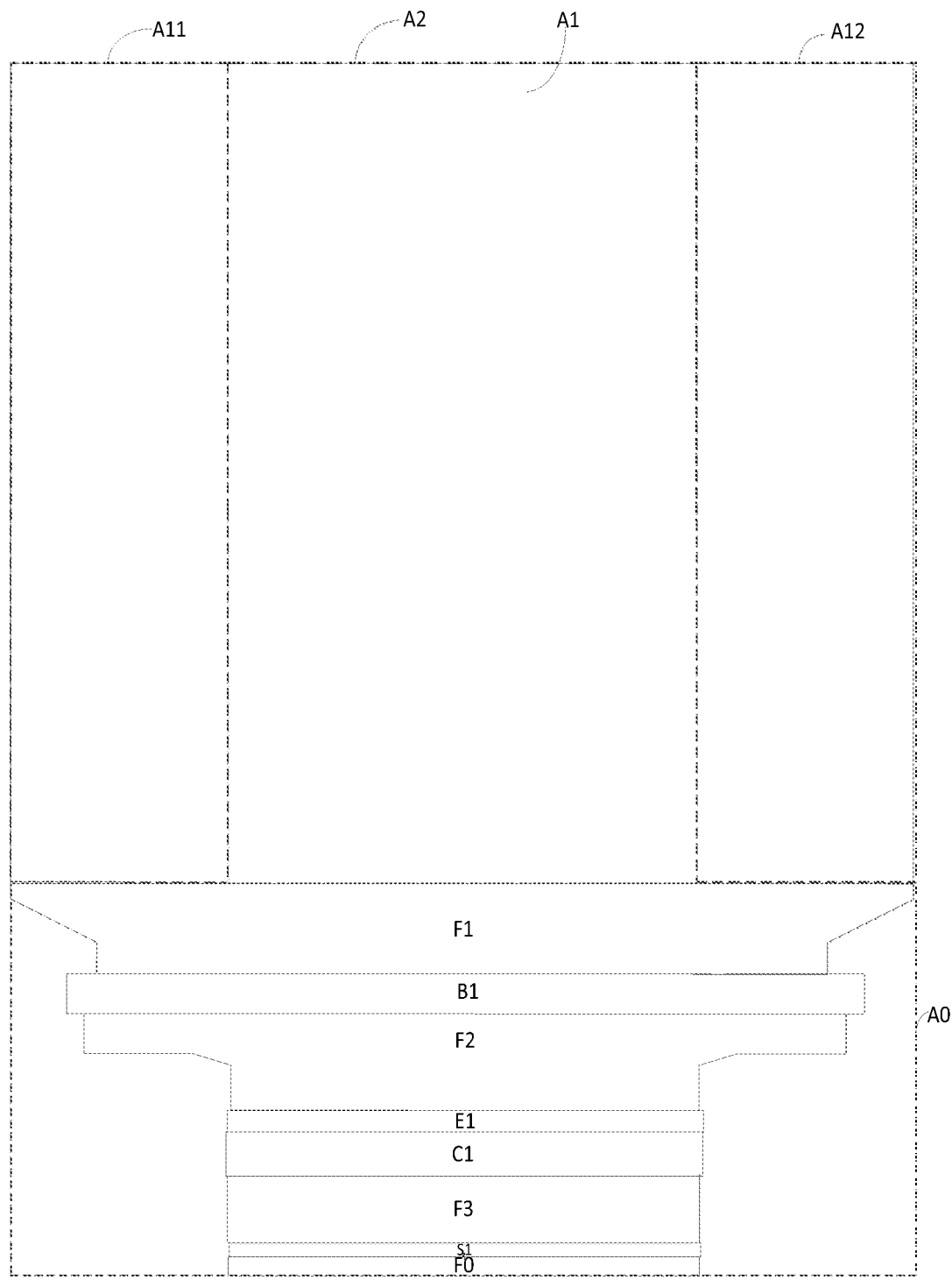
FIG. 3 is a schematic diagram of area division of a display substrate according to at least one embodiment of the present disclosure.

In FIG. 3, the area marked F1 is the first fan-out area, the area marked B1 is the bending area, the area marked F2 is the second fan-out area, the area marked E1 is the electrostatic protection area, and the area marked C1 is the cell forming test area. The area marked F3 is the third fan-out area, the area marked S1 is the chip attaching area in which the source driver is arranged, and the area marked F0 is the area where a flexible circuit board (FPC) is arranged.

Figure 4:
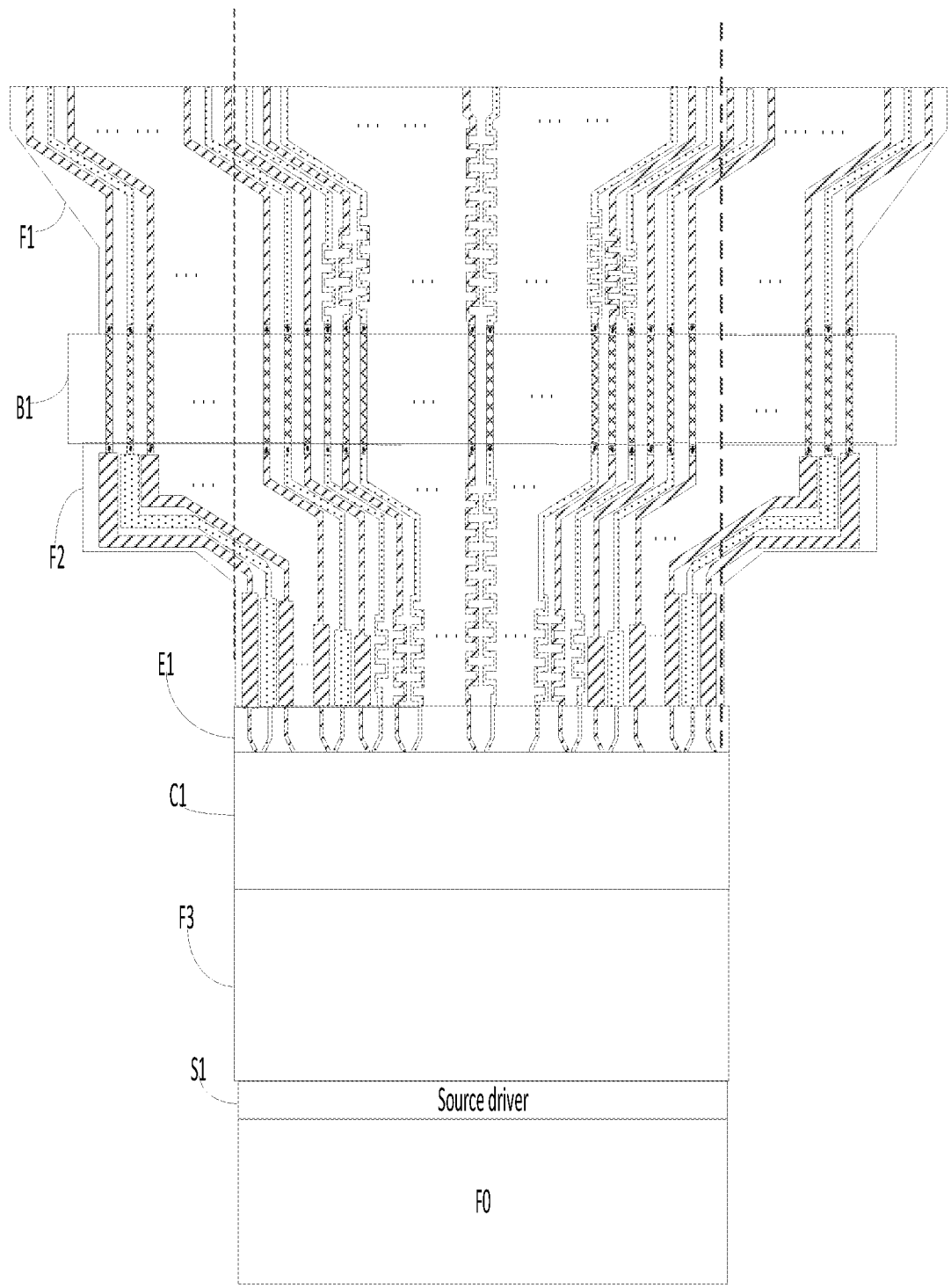
FIG. 4 is a schematic diagram of data signal leads included in the display substrate according to at least one embodiment of the present disclosure.

FIG. 4 shows a structural diagram of a plurality of data signal leads arranged in the frame area in at least one embodiment of the present disclosure. In at least one embodiment shown in FIG. 4, the source driver is arranged in the chip attaching area S1.

Figure 5:
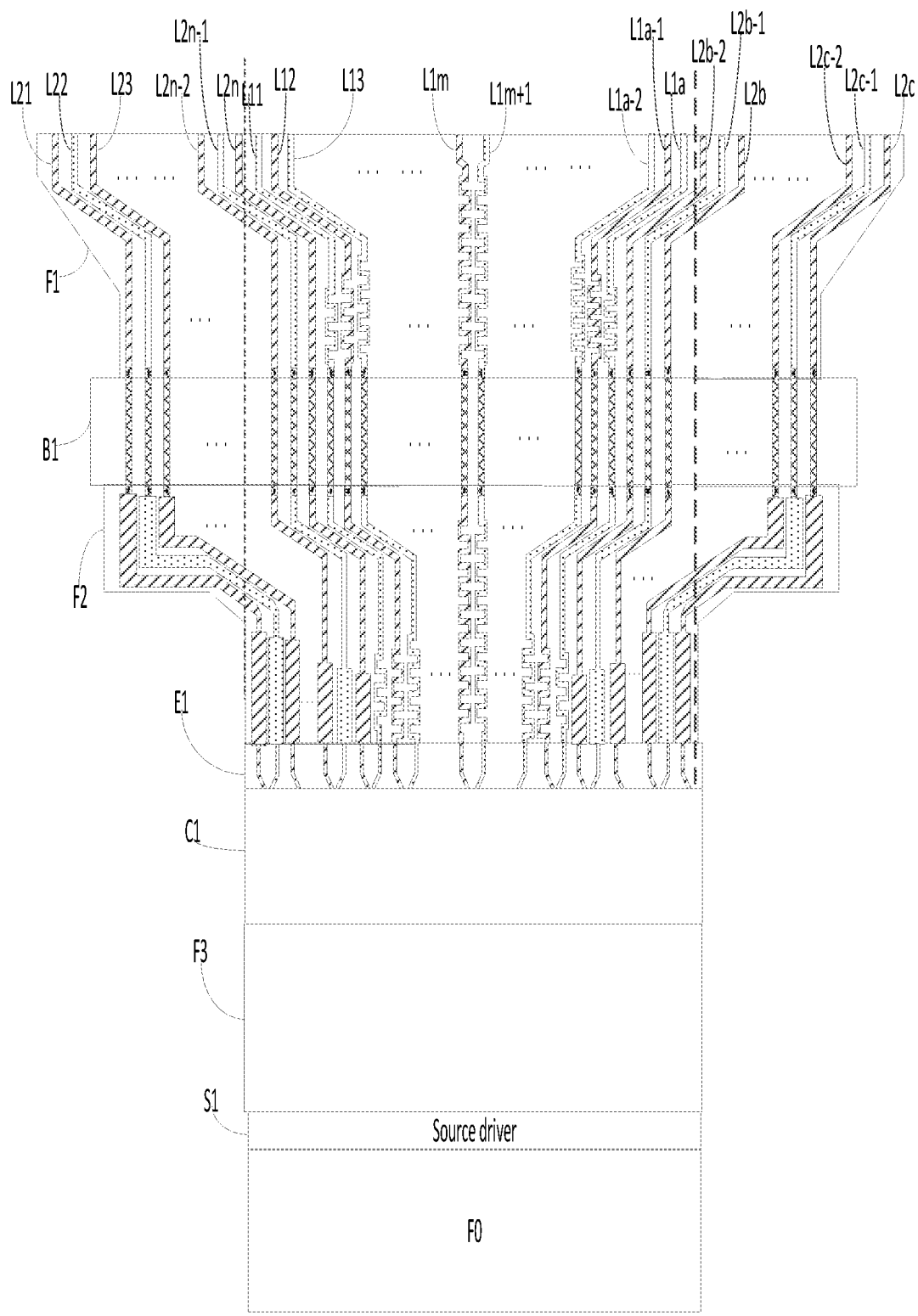
FIG. 5 is a schematic diagram of adding the identifier of each data signal lead on the basis of FIG. 4.

As shown in FIG. 5, on the basis of FIG. 4, the data signal leads are labeled.

In FIG. 5, the one labeled L11 is a first first data signal lead, the one marked L12 is a second first data signal lead, and the one marked L13 is a third first data signal lead;

The one labeled L1$m$ is the mth first data signal lead, and the one labeled L1$m$+1 is the (m+1)th first data signal lead;

The one labeled L1$a$–2 is the (a–2)th first data signal lead, the one labeled L1$a$–1 is the (a–1)th first data signal lead, and the one labeled L1$a$ is the ath first data signal lead;

The one labeled L2$b$–2 is the (b–2)th second data signal lead, the one labeled L2$b$–1 is the (b–1)th second data signal lead, and the one labeled L2$b$ is the bth second data signal lead;

The one labeled L2$c$–2 is the (c–2)th second data signal lead, the one labeled L2$c$–1 is the (c–1)th second data signal lead, and the one labeled L2$c$ is the cth second data signal lead.

As shown in FIG. 5, each data signal lead includes a lead portion arranged in the first fan-out area F1, a lead portion arranged in the bending area B1, a lead portion arranged in the second fan-out area F2, and a lead portion arranged in the electrostatic protection area E1, a lead portion arranged in the cell-forming test area C1, and a lead portion arranged in the third fan-out area F3;

In at least one embodiment of the present disclosure, L21 is coupled to D21, L22 is coupled to D22, L23 is coupled to D23, L2$n$–2 is coupled to D2$n$–2, L2$n$–1 is coupled to D2$n$–1, L2$n$ is coupled to D2$n$, L11 is coupled to D11, L12 is coupled to D12, L13 is coupled to D13, L1$m$ is coupled to D1$m$, L1$m$+1 is coupled to D1$m$+1, L1$a$–2 is coupled to D1$a$–2, L1$a$–1 is coupled to D1$a$–1, L1$a$ is coupled to D1$a$, L2$b$–2 is coupled to D2$b$–2, L2$b$–1 is coupled to D2$b$–1, L2$b$ is coupled to D2$b$, L2$c$–2 is coupled to D2$c$–2, L2$c$–1 is coupled to D2$c$–1, and L2$c$ is coupled to D2$c$.

In at least one embodiment of the present disclosure, the display substrate may include a first gate metal layer, a second gate metal layer, a first source-drain metal layer and a second source-drain metal layer, the first gate metal layer, the second gate metal layer, the first source-drain metal layer and the second source-drain metal layer may be stacked in a direction away from the base substrate; each of the data lines may be arranged on at least one of the first source-drain metal layer and the second source-drain metal layer, in the first fan-out area, each data signal lead can be arranged on the first gate metal layer or the second gate metal layer, and each data signal lead can be coupled to the corresponding data line through a transfer portion arranged on the first source-drain metal layer or the second source-drain metal layer.

In at least one embodiment of the present disclosure, the display substrate may include a first gate metal layer, a second gate metal layer, a first source-drain metal layer, a second source-drain metal layer, and an additional source-drain metal layer;

Each of the data lines can be arranged on at least one of the first source-drain metal layer, the second source-drain metal layer, and the additional source-drain metal layer. In the first fan-out area, each data signal lead can be arranged on the first gate metal layer or the second gate metal layer, each data signal lead can be coupled to the corresponding data line through the transfer portion arranged on the first source-drain metal layer, the second source-drain metal layer or the additional source-drain metal layer.

Optionally, on the side of the second gate metal layer away from the base substrate, the first source-drain metal layer, the second source-drain metal layer and the additional source-drain metal layer are sequentially stacked in a direction away from the base substrate; or, on the side of the second gate metal layer away from the base substrate, the additional source-drain metal layer, the first source-drain metal layer and the second source-drain metal layer are sequentially stacked in a direction away from the base substrate; or, the base substrate includes a first base substrate and a second base substrate that are stacked, and the additional source-drain metal layer is arranged between the first substrate and the second substrate, the first source-drain metal layer and the second source-drain metal layer are sequentially stacked on the side of the second gate metal layer away from the base substrate.

In at least one embodiment of the present disclosure, three source-drain metal layers can be used for wiring, which can achieve higher PPI (Pixels Per Inch, the number of pixels per inch) and narrow borders.

Optionally, the first base substrate and the second base substrate may be flexible base substrates, the first base substrate and the second base substrate may be made of polyimide (PI), but not limit thereto.

Figure 6:
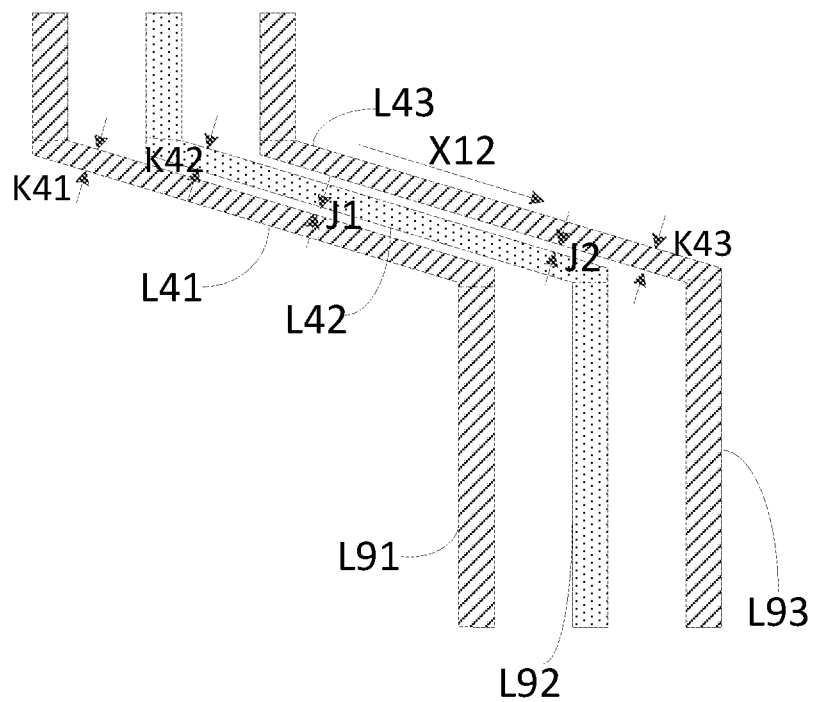
FIG. 6 shows a part included in L2$n$–2 and arranged in the first fan-out area F1, a part included in L2$n$–1 and arranged in the first fan-out area F1 and a part included in L$n$ and arranged in the first fan-out area F1 in FIG. 5.

FIG. 6 shows the part included in L$2n$-2 and arranged in the first fan-out area F1, the part included in L$2n$-1 and arranged in the first fan-out area F1 in FIG. 5;

In FIG. 6, the one marked L41 is the first second lead portion, the one marked L42 is the second second lead portion, and the one marked L43 is the third second lead portion;

L41, L42 and L43 extend along the first second direction X12;

In FIG. 6, the one labeled K41 is the line width of L41, the one labeled K42 is the line width of L42, the one labeled K43 is the line width of L43, and the one labeled J1 is the distance between L41 and L42, the one labeled J2 is the distance between L42 and L43.

In FIG. 6, the first second direction X12 intersects the vertical direction, the first second direction X12 is not perpendicular to the vertical direction, and the first second direction X12 is not substantially perpendicular to the vertical direction.

In at least one embodiment shown in FIG. 6, the angle between the first second direction X12 and the vertical direction is greater than 0 degrees but less than 89.5 degrees or greater than 90.5 degrees and less than 180 degrees.

In at least one embodiment of the present disclosure, the distance between L41 and L42 may be the shortest distance between L41 and L42, and the distance between L42 and L43 may be the shortest distance between L42 and L43.

In at least one embodiment of the present disclosure, K41, K42 and K43 may all be 2.2 um, and J1 and J2 may all be 0.5 um, but not limited thereto.

In FIG. 6, the first sixth lead portion is marked L91, the second sixth lead portion is marked L92, the third sixth lead portion is marked L93, L91 is coupled to L41, L92 is coupled to L42, L93 is coupled to L43;

L91, L92 and L93 may all extend along the third direction.

In at least one embodiment shown in FIG. 6, the third direction is the vertical direction, the line width of L91, the line width of L92, and the line width of L93 can be greater than or equal to 2.6 um and less than or equal to 3.2 um, the shortest distance between L91 and L92, and the shortest distance between L92 and L93 may be greater than or equal to 9 um and less than or equal to 30 um, but not limited thereto.

Figure 7:
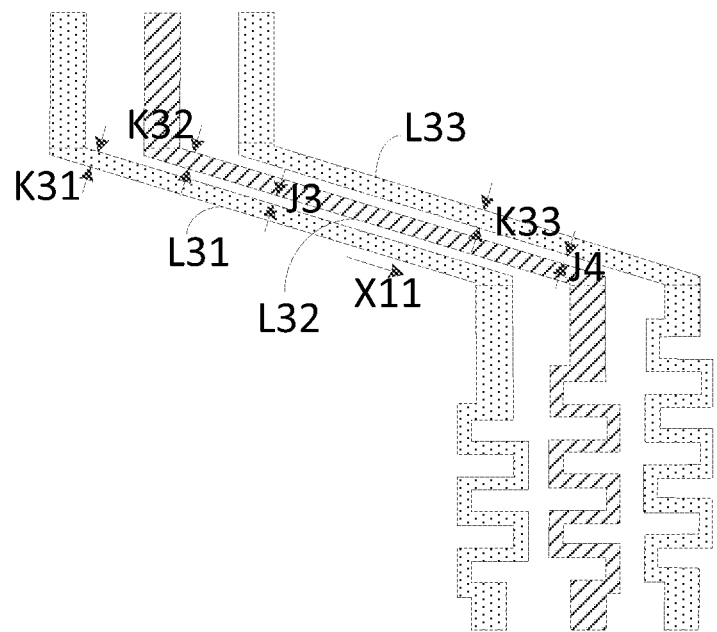
FIG. 7 shows a part included in L11 and arranged in the first fan-out area F1, a part included in L12 and arranged in the first fan-out area F1 and a part included in L13 and arranged in the first fan-out area F1 in FIG. 5.

FIG. 7 shows the part included in L11 and arranged in the first fan-out area F1, the part included in L12 and arranged in the first fan-out area F1, and the part included in L13 and arranged in the first fan-out area F1 in FIG. 5;

In FIG. 7, the one marked L31 is the first first lead portion, the one marked L32 is the second first lead portion, and the one marked L33 is the third first lead portion;

L31, L32 and L33 extend along the first first direction X11;

In FIG. 7, the one labeled K31 is the line width of L31, the one labeled K32 is the line width of L32, the one labeled K33 is the line width of L33, and the one labeled J3 is the distance between L31 and L32, the one labeled J4 is the distance between L32 and L33.

In FIG. 7, the first first direction X11 intersects the vertical direction, the first first direction X11 is not perpendicular to the vertical direction, and the first first direction X11 is not substantially perpendicular to the vertical direction.

In at least one embodiment shown in FIG. 7, the angle between the first first direction X11 and the vertical direction is greater than 0 degrees and less than 89.5 degrees or greater than 90.5 degrees and less than 180 degrees.

In at least one embodiment of the present disclosure, the distance between L31 and L32 may be the shortest distance between L31 and L32, and the distance between L32 and L33 may be the shortest distance between L42 and L43.

In at least one embodiment of the present disclosure, K31, K32 and K33 may all be 1.8 um, and J3 and J4 may all be 0.9 um.

As shown in FIGS. 6 and 7, the line width of each first lead portion is smaller than the line width of each second lead portion, so as to increase the resistance value of the first data signal lead and reduce the resistance value of the second data signal lead, so that the difference between the line resistance values of the data signal leads becomes smaller, and the display uniformity is improved.

Figure 8:
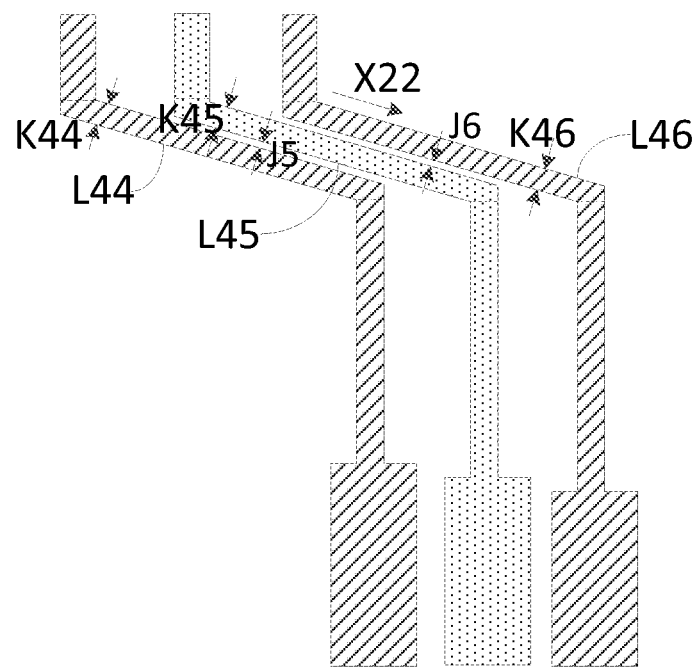
FIG. 8 shows a part included in L2$n$–2 and arranged in the second fan-out area F2, a part included in L2$n$–1 and arranged in the second fan-out area F2 and a part included in L$n$ and arranged in the second fan-out area F2 in FIG. 5.

FIG. 8 shows the part included in L$2n$-2 and arranged in the second fan-out area F2, the part included in L$2n$-1 and arranged in the second fan-out area F2 in FIG. 5;

In FIG. 8, the one labeled L44 is the fourth second lead portion, the one labeled L45 is the fifth second lead portion, and the one labeled L46 is the sixth second lead portion;

L44, L45 and L46 extend along the second second direction X22;

In FIG. 8, the one labeled K44 is the line width of L44, the one labeled K45 is the line width of L45, the one labeled K46 is the line width of L46, and the one labeled J5 is the distance between L44 and L45, the one labeled J6 is the distance between L45 and L46.

In FIG. 8, the second second direction X22 intersects the vertical direction, the second second direction X22 is not perpendicular to the vertical direction, and the second second direction X22 is not substantially perpendicular to the vertical direction.

In at least one embodiment shown in FIG. 8, the angle between the second second direction X22 and the vertical direction is greater than 0 degrees and less than 89.5 degrees or greater than 90.5 degrees and less than 180 degrees. In at least one embodiment of the present disclosure, the distance between L44 and L45 may be the shortest distance between L44 and L45, and the distance between L45 and L46 may be the shortest distance between L45 and L46.

In at least one embodiment of the present disclosure, K44, K45 and K46 may all be 2.3 um, and J5 and J6 may all be 0.5 um, but not limited thereto.

Figure 9:
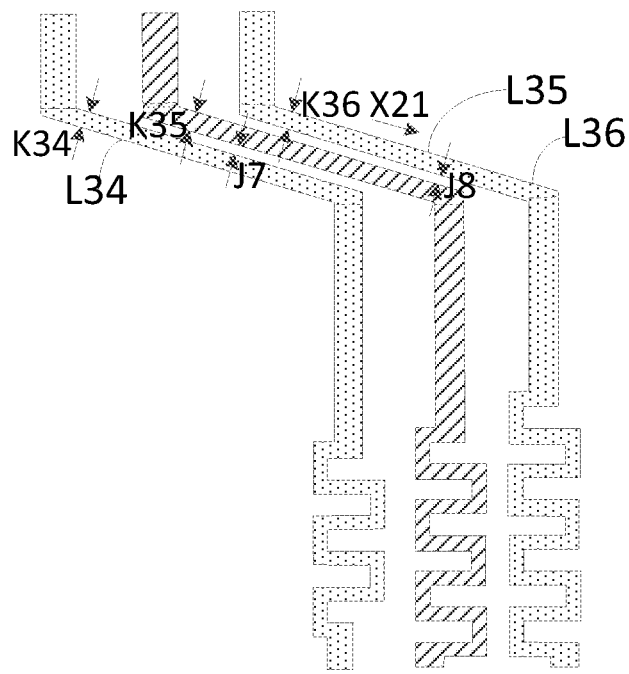
FIG. 9 shows a part included in L11 and arranged in the second fan-out area F2, a part included in L12 and arranged in the second fan-out area F2 and a part included in L13 and arranged in the second fan-out area F2 in FIG. 5.

FIG. 9 shows the part included in L11 and arranged in the second fan-out area F2, the part included in L12 and arranged in the second fan-out area F2, and the part included in L13 and arranged in the second fan-out area F1 in FIG. 5;

In FIG. 9, the one labeled L34 is the fourth first lead portion, the one labeled L35 is the fifth first lead portion, and the one labeled L36 is the sixth first lead portion;

L34, L35 and L36 extend along the second first direction X21;

In FIG. 9, the one labeled K34 is the line width of L34, the one labeled K35 is the line width of L35, the one labeled K36 is the line width of L36, and the one labeled J7 is the space between L34 and L35, the one labeled J8 is the distance between L35 and L36.

In FIG. 9, the second first direction X21 intersects the vertical direction, the second first direction X21 is not perpendicular to the vertical direction, and the second first direction X21 is not substantially perpendicular to the vertical direction.

In at least one embodiment shown in FIG. 9, the angle between the second first direction X21 and the vertical direction is greater than 0 degrees and less than 89.5 degrees or greater than 90.5 degrees and less than 180 degrees.

In at least one embodiment of the present disclosure, the distance between L34 and L35 may be the shortest distance between L34 and L35, and the distance between L35 and L36 may be the shortest distance between L45 and L46.

In at least one embodiment of the present disclosure, K34, K35 and K36 may all be 1.8 um, and J7 and J8 may all be 1.0 um.

As shown in FIG. 8 and FIG. 9, the line width of each first lead portion is smaller than the line width of each second lead portion, so as to increase the resistance value of the first data signal lead and reduce the resistance value of the second data signal lead, so that the difference between the line resistance values of the data signal leads becomes smaller, and the display uniformity is improved.

Optionally, the line width of the first lead portion may be greater than or equal to 1.0 um and less than or equal to 2.0 um, and the line width of the second lead portion may be greater than or equal to 1.5 um and less than or equal to 3.0 um.

In at least one embodiment of the present disclosure, the second data signal lead further includes a third lead portion extending along a fourth direction, there is a third angle between the fourth direction and the third direction; the third angle is greater than or equal to 89.5 degrees and less than or equal to 90.5 degrees;

The line width of the third lead portion is greater than the line width of the second lead portion.

In at least one embodiment of the present disclosure, the fourth direction is perpendicular or substantially perpendicular to the third direction;

The fourth direction being substantially perpendicular to the third direction may mean that: the angle between the fourth direction and the third direction is greater than or equal to 89.5 degrees and less than or equal to 90.5 degrees, and the angle between the fourth direction and the third direction is not equal to 90 degrees; but not limited thereto.

In specific implementation, the second data signal lead may include a third lead portion extending along the fourth direction, and the line width of the third lead portion may be larger than the line width of the second lead portion, so as to further reduce the resistance value of the second data signal lead.

Figure 10:
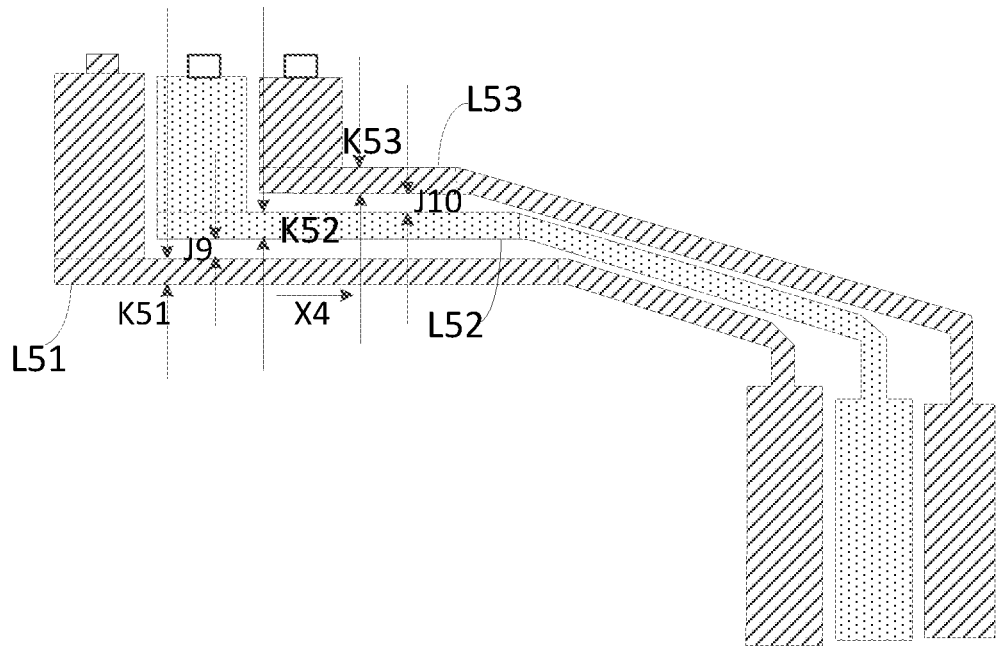
FIG. 10 shows a part included in L21 and arranged in the second fan-out area F2, a part included in L22 and arranged in the second fan-out area F2 and a part included in L23 and arranged in the second fan-out area F2 in FIG. 5.

FIG. 10 shows the part included in L21 and arranged in the second fan-out area F2, the part included in L22 and arranged in the second fan-out area F2, and the part included in L23 and arranged in the second fan-out area F2 in FIG. 5;

In FIG. 10, the one marked L51 is the first third lead portion, the one marked L52 is the second third lead portion, and the one marked L53 is the third third lead portion;

The extending direction of L51, the extending direction of L52 and the extending direction of L53 are the fourth direction X4.

In at least one embodiment shown in FIG. 10, the fourth direction X4 is a horizontal direction, and the fourth direction X4 is perpendicular to the third direction.

As shown in FIG. 10, the one labeled K51 is the line width of L51, the one labeled K52 is the line width of L52, the one labeled K53 is the line width of L53, and the one labeled J9 is the distance between L51 and L52, the one labeled J10 is the distance between L52 and L53.

In at least one embodiment of the present disclosure, the distance between L51 and L52 may be the shortest distance between L51 and L52, and the distance between L52 and L53 may be the shortest distance between L52 and L53.

In at least one embodiment shown in FIGS. 10, K51, K52 and K53 may be equal to 2.7 um, and J9 and J10 may be equal to 2 um, but not limited thereto.

In at least one embodiment of the present disclosure, the line width of the third lead portion is greater than or equal to 1.8 um and less than or equal to 4.0 um, but not limited thereto.

In at least one embodiment of the present disclosure, the second data signal lead includes a fourth lead portion extending along a third direction;

The line width of the fourth lead portion is greater than the line width of the second lead portion.

In specific implementation, the resistance value of the second data signal lead can be further compensated, and the line width of the part of the lead portion extending along the third direction included in the second data signal lead is set to be larger, so as to further reduce the resistance value of the second data signal lead.

Figure 11:
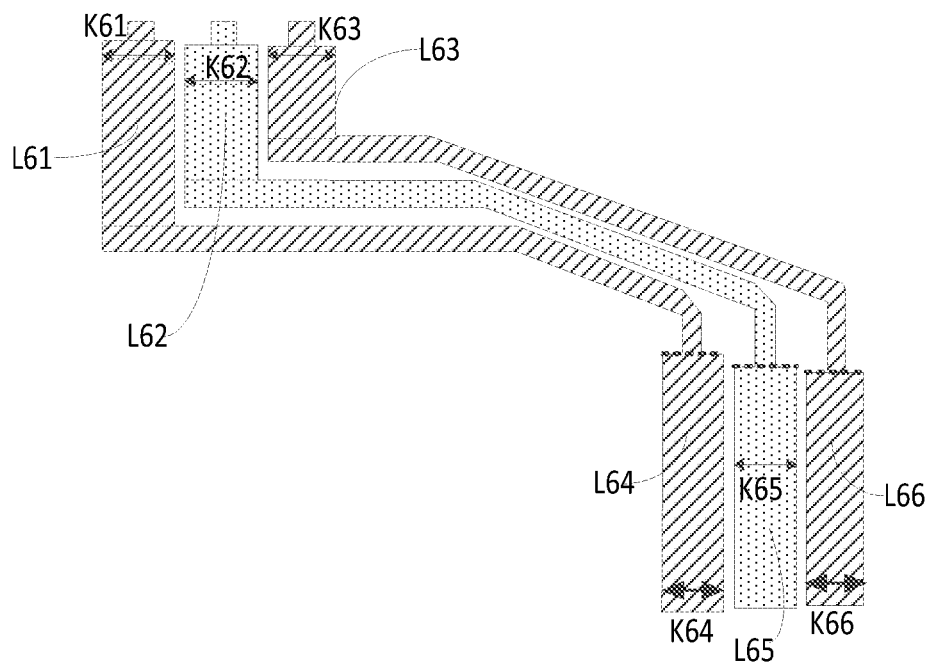
FIG. 11 shows a part included in L21 and arranged in the second fan-out area F2, a part included in L22 and arranged in the second fan-out area F2 and a part included in L23 and arranged in the second fan-out area F2 in FIG. 5.

FIG. 11 shows the part included in L21 and arranged in the second fan-out area F2, the part included in L22 and arranged in the second fan-out area F2, and the part included in L23 and arranged in the second fan-out area F2 in FIG. 5;

In FIG. 11, the one marked L61 is the first fourth lead portion, the one marked L62 is the second fourth lead portion, the one marked L63 is the third fourth lead portion; the one marked L64 is the fourth fourth lead portion, the one marked L65 is the fifth fourth lead portion, and the one marked L66 is the sixth fourth lead portion;

The first fourth lead portion L61, the second fourth lead portion L62, the third fourth lead portion L63, the fourth fourth lead portion L64, the fifth fourth lead portion L65, the sixth fourth lead portion L66 all extend along the vertical direction.

As shown in FIG. 11, the closer to the two sides, the longer the length of the fourth lead portion included in each second data signal lead is, so as to reduce the resistance value of the second data signal lead.

In at least one embodiment corresponding to FIG. 11, the line width K61 of L61, the line width K62 of L62, the line width K63 of L63, the line width K64 of L64, the line width K65 of L65, and the line width K66 of L66 can be greater than or equal to 3 um and less than or equal to 13 um, the shortest distance among the fourth lead portions can be greater than or equal to 0.8 um and less than or equal to 1.5 um, but not limited thereto.

In at least one embodiment of the present disclosure, the frame area includes a first fan-out area and a second fan-out area arranged along a direction away from the display area;

The line width of the second lead portion in the first fan-out area is smaller than the line width of the second lead portion in the second fan-out area.

As shown in FIG. 6 and FIG. 8, when the longitudinal length of the second fan-out area is greater than the longitudinal length of the first fan-out area, the line width of the second lead portion in the first fan-out area may be smaller than that of the second lead portion in the second fan-out area.

In at least one embodiment of the present disclosure, the frame area includes a first fan-out area and a second fan-out area arranged along a direction away from the display area; the first data signal lead include serpentine lead portions;

The serpentine lead portion includes a plurality of first lead portions extending along a third direction, and a plurality of second lead portions extending along a fifth direction; the first lead portions and the second lead portions are arranged alternately, the adjacent first lead portion and the second lead portion are coupled to each other;

There is a fourth angle between the fifth direction and the third direction, and the fourth angle is greater than or equal to 89.5 degrees and less than or equal to 90.5 degrees.

In at least one embodiment of the present disclosure, the fifth direction is perpendicular or substantially perpendicular to the third direction;

The fifth direction being substantially perpendicular to the third direction may mean that: the angle between the fifth direction and the third direction is greater than or equal to 89.5 degrees and less than or equal to 90.5 degrees, and the angle between the fifth direction and the third direction is not equal to 90 degrees; but not limited thereto.

In a specific implementation, the first data signal lead may include a serpentine lead portion to increase the length of the first data signal lead, thereby further increasing the resistance value of the first data signal lead for resistance compensation.

Figure 12:
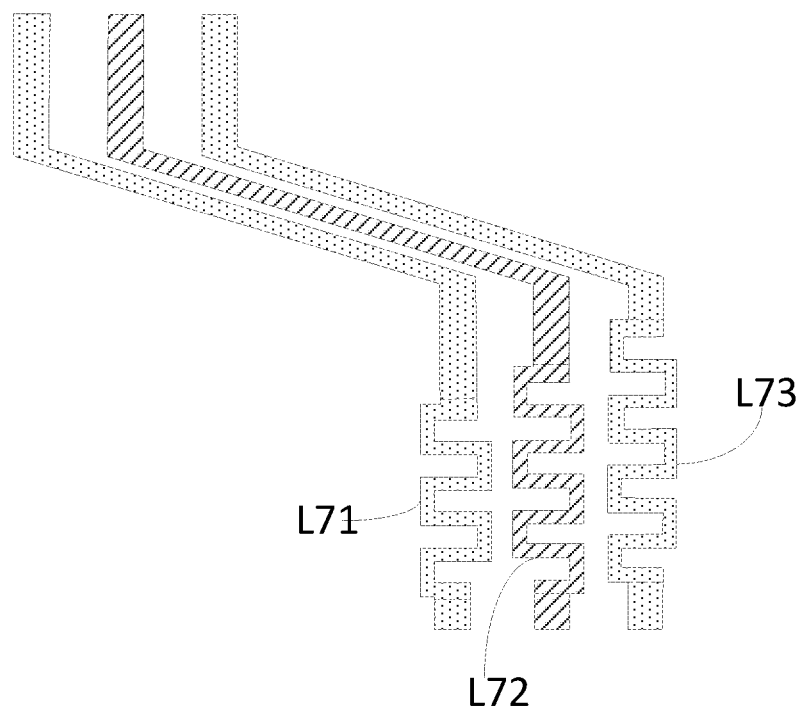
FIG. 12 shows a part included in L11 and arranged in the first fan-out area F1, a part included in L12 and arranged in the first fan-out area F1 and a part included in L13 and arranged in the first fan-out area F1 in FIG. 5.

FIG. 12 shows the part included in L11 and arranged in the first fan-out area F1, the part included in L12 and arranged in the first fan-out area F1, the part included in L13 and arranged in the first fan-out area in FIG. 5;

As shown in FIG. 5 and FIG. 12, L11 includes a first serpentine lead portion L71, L12 includes a second serpentine lead portion L72, and L13 includes a third serpentine lead portion L73.

As shown in FIG. 12, the shortest distance J11 between L71 and L72, and the shortest distance J12 between L72 and L73 can be greater than or equal to 1.2 um and less than or equal to 2 um, for example, J11 and J12 can be equal to 1.5 um, but is not limited.

Figure 13:
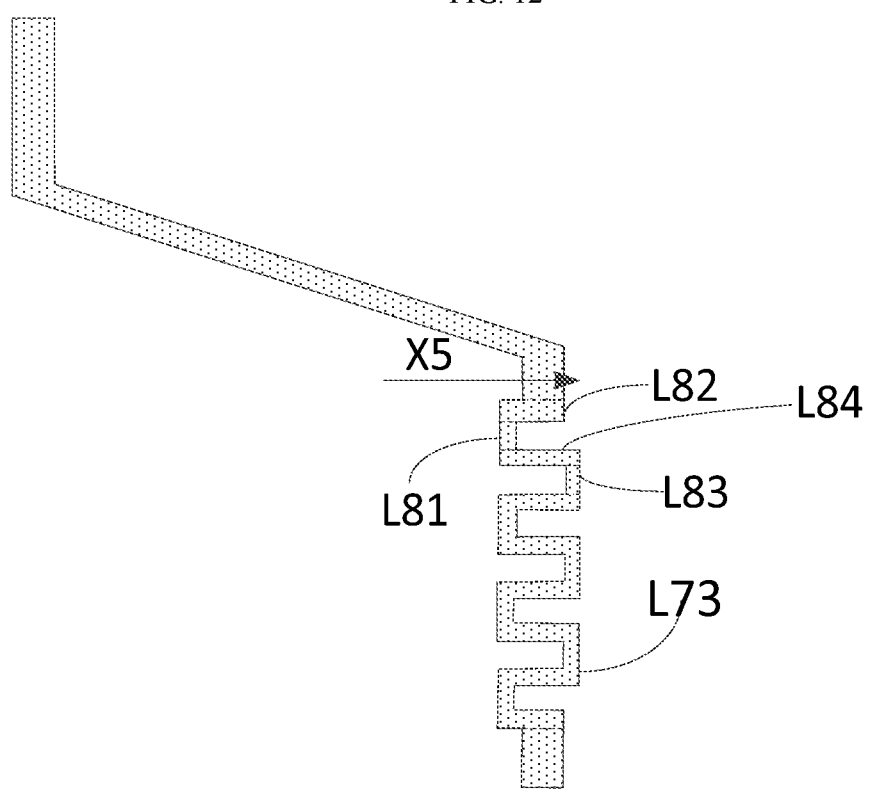
FIG. 13 is a schematic structural diagram of the third serpentine lead portion L73 in FIG. 12.

FIG. 13 is a schematic structural diagram of the third serpentine lead portion L73 in FIG. 12, wherein, the one marked L81 is the first first lead portion, the one marked L82 is the first second lead portion, and the one marked L83 is the second first lead portion, and the one labeled L84 is the second second lead portion;

L81 extends along the vertical direction, L82 extends along the fifth direction X5, and L81 and L82 are coupled to each other.

In at least one embodiment shown in FIG. 13, the fifth direction X5 may be a horizontal direction, the third direction is a vertical direction, and the fifth direction is perpendicular to the third direction.

As shown in FIG. 13, the third serpentine lead portion L73 includes a plurality of first lead portions extending along the vertical direction and a plurality of second lead portions extending along the horizontal direction, adjacent first lead portions and second lead portions are coupled to each other.

As shown in FIG. 13, the shortest distance between the first second lead portion L82 included in the L73 and the second second lead portion L84 included in the L73 may be 2.7 um, but it is not limited thereto.

As shown in FIG. 5, in both the first fan-out area and the second fan-out area, the first data signal lead may include a serpentine lead portion, and the closer to the middle, the longer the length of the serpentine lead portion is, so as to increase the resistance value of the first data signal lead.

In at least one embodiment of the present disclosure, the line width of the first lead portion and the line width of the second lead portion included in the same serpentine lead portion may be equal, but not limited thereto;

The line width of the first lead portion and the line width of the second lead portion may both be greater than or equal to 1.8 um and less than or equal to 2.4 um, but not limited thereto.

Optionally, the shortest distance between two adjacent second lead portions included in the same serpentine lead portion may be greater than or equal to 2.4 um and less than or equal to 3 um; the shortest distance between two adjacent serpentine lead portions can be greater than or equal to 1.0 um and less than or equal to 2 um.

In at least one embodiment of the present disclosure, the frame area includes a first fan-out area and a second fan-out area arranged along a direction away from the display area; in the first fan-out area, the sum of the line width of the first lead portion and the shortest distance between two adjacent first lead portions is equal to the sum of the line width of the second lead portion and the shortest distance between two adjacent second lead portions;

In the second fan-out area, the sum of the line width of the first lead portion and the shortest distance between two adjacent first lead portions is equal to the sum of the line width of the second lead portion and the shortest distance between two adjacent second lead portions.

In specific implementation, in order to facilitate the layout, in the first fan-out area, the sum of the line width of the first lead portion and the shortest distance between two adjacent first lead portions is set to be equal to the sum of the line width of the second lead portion and the shortest distance between two adjacent second lead portions, in the second fan-out area, the sum of the line width of the first lead portion and the shortest distance between two adjacent first lead portions is set to be equal to the sum of the line width of the second lead portion and the shortest distance between two adjacent second lead portions As shown in FIG. 6, in the first fan-out area, the line width of each second lead portion can be 2.2 um, and the shortest distance between two adjacent second lead portions can be 0.5 um; as shown in FIG. 7, in the first fan-out area, the line width of each first lead portion can be 1.8 um, and the shortest distance between two adjacent first lead portions can be 0.9 um; that is, in the first fan-out area, the sum of the line width of the first lead portion and the shortest distance between two adjacent first lead portions is equal to the sum of the line width of the second lead portion and the shortest distance between two adjacent second lead portions.

As shown in FIG. 8, in the second fan-out area, the line width of each second lead portion can be 2.3 um, and the shortest distance between two adjacent second lead portions can be 0.5 um; as shown in FIG. 9, in the second fan-out area, the line width of each first lead portion can be 1.8 um, and the shortest distance between two adjacent first lead portions can be 1 um; that is, in the second fan-out area, the sum of the line width of the first lead portion and the shortest distance between two adjacent first lead portions is equal to the sum of the line width of the second lead portion and the shortest distance between two adjacent second lead portions.

Optionally, the shortest distance between two adjacent first lead portions is greater than or equal to 1.0 um and less than or equal to 2.0 um;

The shortest distance between two adjacent second lead portions is greater than or equal to 0.5 um and less than or equal to 1.0 um;

But not limited to this.

By setting the data signal leads in the frame area as shown in FIG. 5, Rmax is set to 9.3 kΩ, Rmin is set to 7.1 kΩ, Rmax/Rmin is set to 1.3, and the current value I1 of the outermost data signal leads is set to $2.261\ e^{-11}$ nanoampere, and the current value I2 of the data signal lead in the center is set to $2.325\ e^{-11}$ nanoampere, so that the current difference ratio between the outermost data signal lead and the center data signal lead is reduced to 2.75%, which significantly reduce the line resistance difference of the data signal leads, and the requirement of low gray scale uniformity is met as much as possible.

In at least one embodiment of the present disclosure, the frame area includes a fan-out area, and the fan-out area includes a first fan-out area and a second fan-out area arranged along a direction away from the display area;

The display substrate includes a base substrate, and a first metal layer and a second metal layer stacked along a direction away from the base substrate;

The lead portion of the first data signal lead arranged in the fan-out area is included in the first metal layer or the second metal layer;

The lead portion of the second data signal lead arranged in the fan-out area is included in the first metal layer or the second metal layer;

The portions of adjacent data signal leads arranged in the fan-out area are included in different layers.

In specific implementation, in the first fan-out area and the second fan-out area, each data signal lead can be arranged on the first metal layer or the second metal layer, and two adjacent data signal leads can be arranged on different layers to increase the distance between two adjacent data signal leads on the same layer, and reduce the signal interference between two adjacent data signal leads on the same layer.

In at least one embodiment of the present disclosure, parts of the same data signal lead located in the first fan-out area and the second fan-out area are arranged on the same layer.

In at least one embodiment of the present disclosure, the first metal layer may be a first gate metal layer, and the second metal layer may be a second gate metal layer, but not limited thereto.

In at least one embodiment of the present disclosure, since the high voltage line and the low voltage line inevitably overlap the data signal lead in the fan-out area, the data signal lead cannot arranged on the same layer as the high voltage line and the low voltage line, and since the high voltage line and the low voltage line are arranged on the source-drain metal layer, in the fan-out area, the data signal lead is arranged on the first gate metal layer or the second gate metal layer.

As shown in FIG. 5, the part included in L21 and arranged in the first fan-out area, the part included in L21 and arranged in the second fan-out area, the part included in L23 and arranged in the first fan-out area, and the part included in L21 and arranged in the second fan-out area, the part included in L2n−2 and arranged in the first fan-out area, the part included in L2n−2 and arranged in the second fan-out area, the part included in L2n and arranged in the first fan-out area, the part included in L2n and arranged in the second fan-out area, the part included in L12 and arranged in the first fan-out area, the part included in L12 and arranged in the second fan-out area, the part included in L1m and arranged in the first fan-out area, the part included in L1m and arranged in the second fan-out area, the part included in L1a−1 and arranged in the first fan-out area, the part included in L1a−1 and arranged in the second fan-out area, the part included in L2b−2 and arranged in the first fan-out area, the part included in L2b−2 and arranged in the second fan-out area, the part included in L2b and arranged in the first fan-out area, the part included in L2b and arranged in the second fan-out area part, the part included in L2c−2 and arranged in the first fan-out area, the part included in L2c−2 and arranged in the second fan-out area, the part included in L2c and arranged in the first fan-out area, and the part included in L2c and arranged in the second fan-out area are all arranged in the first gate metal layer;

The part included in L22 and arranged in the first fan-out area, the part included in L22 and arranged in the second fan-out area, the part included in L2n−1 and arranged in the first fan-out area, and the part included in L2n−1 and arranged in the second fan-out area, the part included in L11 and arranged in the first fan-out area, the part included in L11 and arranged in the second fan-out area, the part included in L13 and arranged in the first fan-out area, the part included in L13 and arranged in the second fan-out area, the part included in L1m+1 and arranged in the first fan-out area, the part included in L1m+1 and arranged in the second fan-out area, the part included in L1a−2 and arranged in the first fan-out area, the part included in L1a−2 and arranged in the second fan-out area, the part included in L1a and arranged in the first fan-out area, the part included in L1a and arranged in the second fan-out area, and the part included in L2b−1 and arranged in the first fan-out area, the part included in L2b−1 and arranged in the second fan-out area, the part included in L2c−1 and arranged in the first fan-out area, and the part included in L2c−1 and arranged in the second fan-out area may be all arranged on the second gate metal layer.

In at least one embodiment of the present disclosure, the frame area further includes a bending area arranged between the first fan-out area and the second fan-out area, and the display substrate further includes a source-drain metal layer arranged on the side of the second gate metal layer away from the first gate metal layer;

The data signal lead also includes a fifth lead portion arranged in the bending area; the fifth lead portion is included in the source-drain metal layer.

Optionally, the source-drain metal layer includes a first source-drain metal layer and a second source-drain metal layer; on the side of the second metal layer away from the base substrate, the first source-drain metal layer and the second source-drain metal layer are sequentially stacked in a direction away from the base substrate;

The fifth lead portion is included in at least one of the first source-drain metal layer and the second source-drain metal layer.

In at least one embodiment of the present disclosure, the fifth lead portion may extend along a third direction, but not limited thereto.

In at least one embodiment of the present disclosure, an active layer, a first gate metal layer, a second gate metal layer, an interlayer dielectric layer, a first source-drain metal layer, a first planarization layer, a second source-drain metal layer and a second planarization layer are subsequently arranged on the base substrate, the interlayer dielectric layer (the interlayer dielectric layer can be an inorganic layer) needs to be removed in the bending area, and if in the bending area, the above-mentioned data signal leads are arranged on the first gate metal layer or the second gate metal layer, which will affect the flatness of the gate metal layer, and in severe cases will cause the gate metal layer to break. Therefore, in the bending area, the data signal lead is arranged on at least one of the first source-drain metal layer and the second source-drain metal layer.

As shown in FIG. 5, the fifth lead portion arranged in the bending area included in each data signal lead is arranged on the second source-drain metal layer.

In at least one embodiment of the present disclosure, the display substrate may include a first source-drain metal layer, a second source-drain metal layer and an additional source-drain metal layer; the fifth lead portion may be included in at least one of the first source-drain metal layer, the second source-drain metal layer, and the additional source-drain metal layer;

On the side of the second metal layer away from the base substrate, the first source-drain metal layer, the second source-drain metal layer and the additional source-drain metal layer are sequentially stacked along a direction away from the base substrate; or, on the side of the second metal layer away from the base substrate, the additional source-drain metal layer, the first source-drain metal layer and the second source-drain metal layer are sequentially stacked in a direction away from the base substrate; or, the base substrate includes a first base substrate and a second base substrate that are stacked, and the additional source-drain metal layer is arranged between the first base substrate and the second base substrate, on the side of the second metal layer away from the base substrate, the first source-drain metal layer and the second source-drain metal layer are sequentially stacked.

In specific implementation, when the display substrate includes only one source-drain metal layer, the data signal leads may be included in the source-drain metal layer in the bending area; when the display substrate includes two source-drain layers the data signal lead may be included in at least one of the first source-drain metal layer and the second source-drain metal layer in the bending area; when the display substrate includes the first source-drain metal layer, the second source-drain metal layer, and the additional source-drain metal layer, the data signal lead may be included in at least one of the first source-drain metal layer, the second source-drain metal layer, the additional source-drain metal layer in the bending area.

Figure 14:
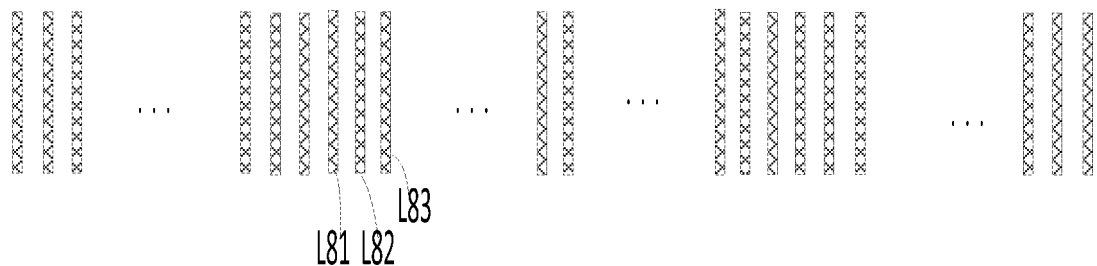
FIG. 14 shows a part included in each data signal lead line and arranged in the bending area B1 in FIG. 5.

FIG. 14 shows the part included in each data signal lead line and arranged in the bending area B1 in FIG. 5;

In FIG. 14, the one marked L81 is the first fifth lead portion, the one marked L82 is the second fifth lead portion, and the one marked L83 is the third fifth lead portion;

The first fifth lead portion L81 is the part included in L11 and arranged in the bending area B1, the second fifth lead portion L82 is the part included in L12 and arranged in the bending area B1, and the third fifth lead portion L83 is the part included in L13 and arranged in the bending area B1;

L81, L82 and L83 are all arranged on the second source-drain metal layer, and L81, L82 and L83 all extend along the vertical direction.

In at least one embodiment of the present disclosure, the line width of each fifth lead portion may be greater than or equal to 7 um and less than or equal to 10 um, and the shortest distance between two adjacent fifth lead portions may be greater than or equal to 8 um and less than or equal to 13 um.

In at least one embodiment of the present disclosure, the fan-out area further includes a third fan-out area, and the frame area includes an electrostatic protection area and a cell-forming test area;

The second fan-out area, the electrostatic protection area, the cell-forming test area and the third fan-out area are arranged in sequence along a direction away from the display area;

The lead portion included in the first data signal lead and arranged in the electrostatic protection area and the cell-forming test area is arranged on the same layer as the lead portion included in the first data signal lead and arranged in the fan-out area;

The lead portion included in the second data signal lead and arranged in the electrostatic protection area and the cell-forming test area is arranged in the same layer as the lead portion included in the second data signal lead and arranged in the fan-out area.

In a specific implementation, the first data signal leads include the parts included in the first data signal lead and arranged in the first fan-out area, the second fan-out area, the third fan-out area, the electrostatic protection area and the cell-forming test area may be arranged in the same layer, the parts included in the second data signal lead and arranged in the first fan-out area, the second fan-out area, the third fan-out area, the electrostatic protection area and the cell-forming test area may be located in the same layer to facilitate wiring.

In at least one embodiment shown in FIG. 5, in the cell-forming test area C1, the line width of each data signal lead may be greater than or equal to 3 um and less than or equal to 4 um, and the distance between two adjacent data signal leads The distance in a horizontal direction can be greater than or equal to 3 um and less than or equal to 4 um, or the distance between two adjacent data signal leads along the horizontal direction can be greater than or equal to 18 um and less than or equal to 27 um, but not limited thereto.

Figure 15:
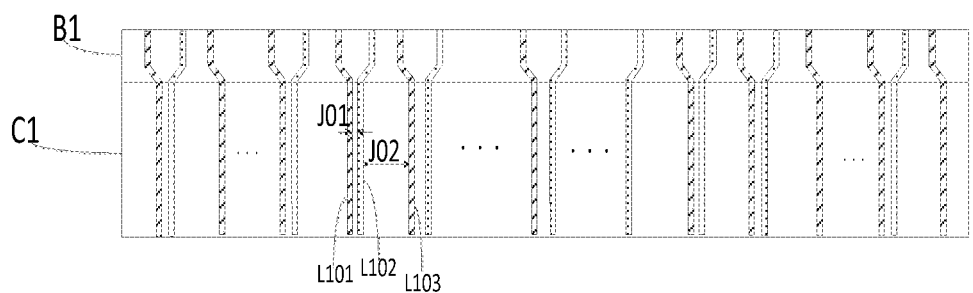
FIG. 15 shows a part included in each data signal lead line and arranged in the electrostatic protection area E1 and the cell-forming test area C1.

FIG. 15 shows that the part included in each data signal lead and arranged in electrostatic protection area E1 and cell-forming test area C1 in FIG. 5;

In FIG. 15, the one labeled L101 is the first seventh lead portion, the one labeled L102 is the second seventh lead portion, and the one labeled L103 is the third seventh lead portion;

L101 is the part included in L11 and arranged in the cell-forming test area C1, L102 is the part included in L12 and arranged in the cell-forming test area C1, and L103 is the part included in L13 and arranged in the cell-forming test area C1;

L101, L102 and L103 may all extend in the vertical direction.

As shown in FIG. 15, the one labeled J01 is the distance between L101 and L102 along the horizontal direction, and J01 can be greater than or equal to 3 um and less than or equal to 4 um;

The one labeled J02 is the distance between L102 and L103 along the horizontal direction, and J02 can be greater than or equal to 18 um and less than or equal to 27 um;

But not limited to this.

In at least one embodiment shown in FIG. 5, in the third fan-out area F3, the line width of each of the data signal lead may be greater than or equal to 3 um and less than or equal to 5 um.

In at least one embodiment of the present disclosure, in the third fan-out region, each data signal lead may include an eighth lead portion extending along the third direction, and a distance between two adjacent eighth lead portions along the horizontal direction may be greater than or equal to 10 um and less than or equal to 20 um, but not limited thereto.

Figure 16:
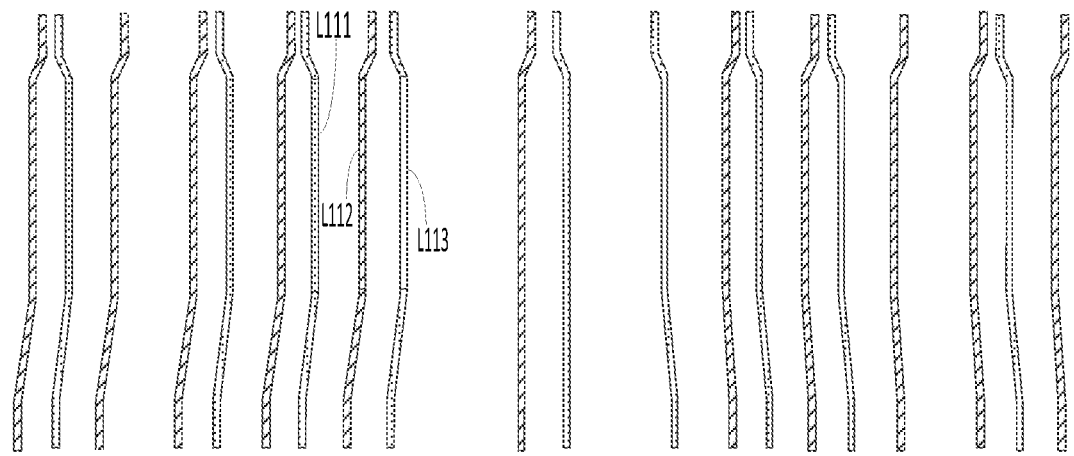
FIG. 16 shows a part included in L11 and arranged in the third fan-out area F3, a part included in L12 and arranged in the third fan-out area F3 and a part included in L13 and arranged in the third fan-out area F13 in FIG. 5.

FIG. 16 shows the part included in L11 and arranged in the third fan-out area F3, the part included in L12 and arranged in the third fan-out area F3, and the part included in L13 and arranged the third fan-out area F3 in FIG. 5;

As shown in FIG. 16, in the third fan-out area, L11 includes a first eighth lead portion L111 extending in the vertical direction, L12 includes a second eighth lead portion L112 extending in the vertical direction, and L13 includes a third eighth lead portion L113 extending in the vertical direction.

In at least one embodiment of the present disclosure, since the part included in each data signal lead and arranged in the first fan-out area F1 is arranged on the first gate metal layer or the second gate metal layer, the part included in each data signal lead and arranged in the bending area B1 is arranged on the second source-drain metal layer, so the part included in each data signal lead and arranged in the first fan-out area F1 is coupled to the part included in the data signal lead and arranged in the bending area through the corresponding first transfer portion; the first transfer portion is included in the second source-drain metal layer.

Figure 17:
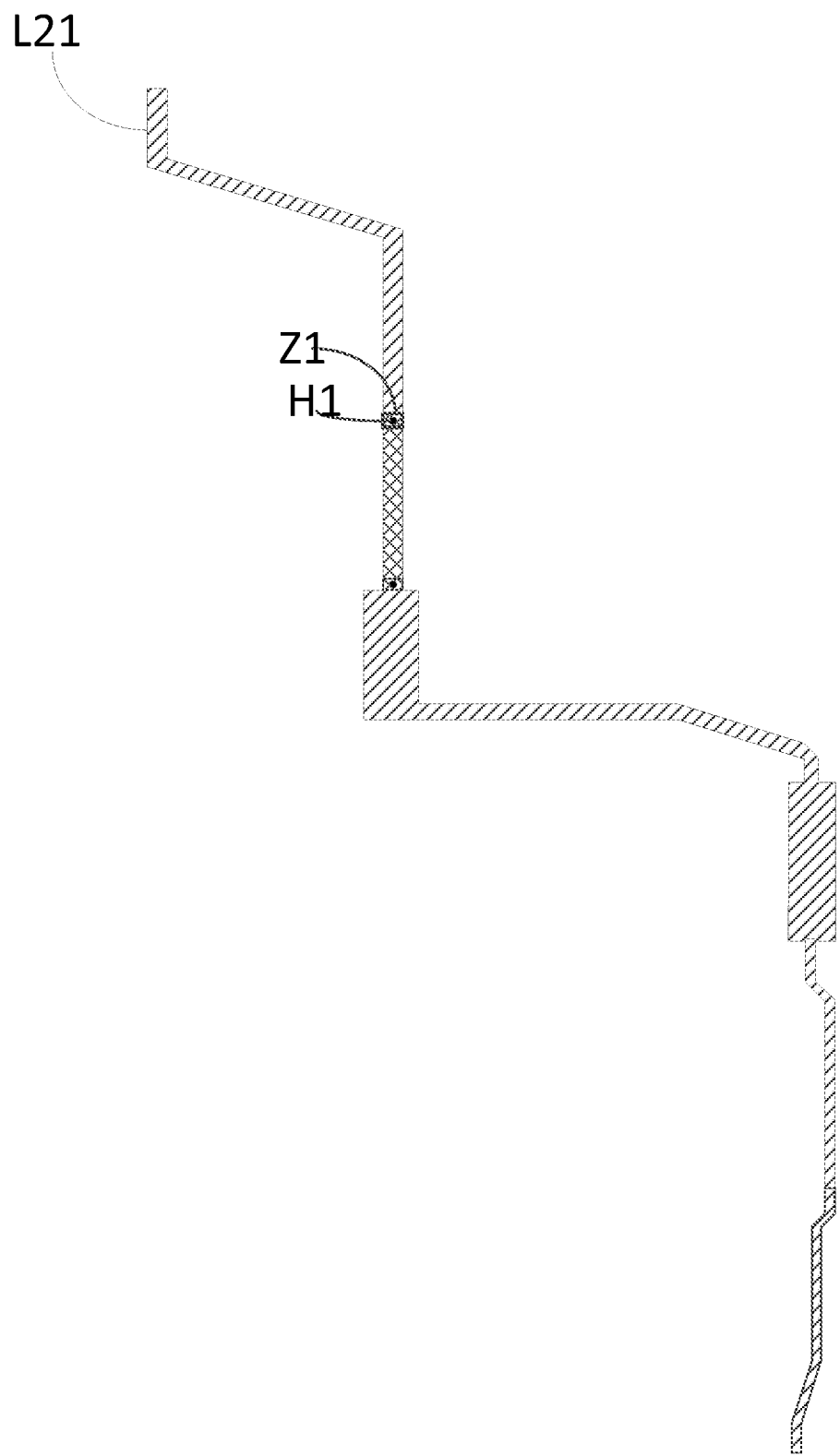
FIG. 17 is a schematic diagram of the part included in L21 and arranged in the first fan-out area F1 in FIG. 5 being coupled to the first transfer portion Z1 through a corresponding first via hole H1.

As shown in FIG. 17, the part included in L21 and arranged in the first fan-out area F1 is coupled to the first transfer portion Z1 through a corresponding first via hole H1, and the first transfer portion Z1 is coupled to the part included in L21 and arranged in the bending area B1.

In at least one embodiment of the present disclosure, since the part included in each data signal lead and arranged in the bending area B1 is arranged on the second source-drain metal layer, the part included in each data signal lead and arranged in the second fan-out area F2 is arranged on the first gate metal layer or a second gate metal layer, so the part included in each data signal lead and arranged in the second fan-out area F2 is coupled to the part included in the data signal lead and arranged in the bending area through the second transfer portion; the second transfer portion is included in the second source-drain metal layer.

Figure 18:
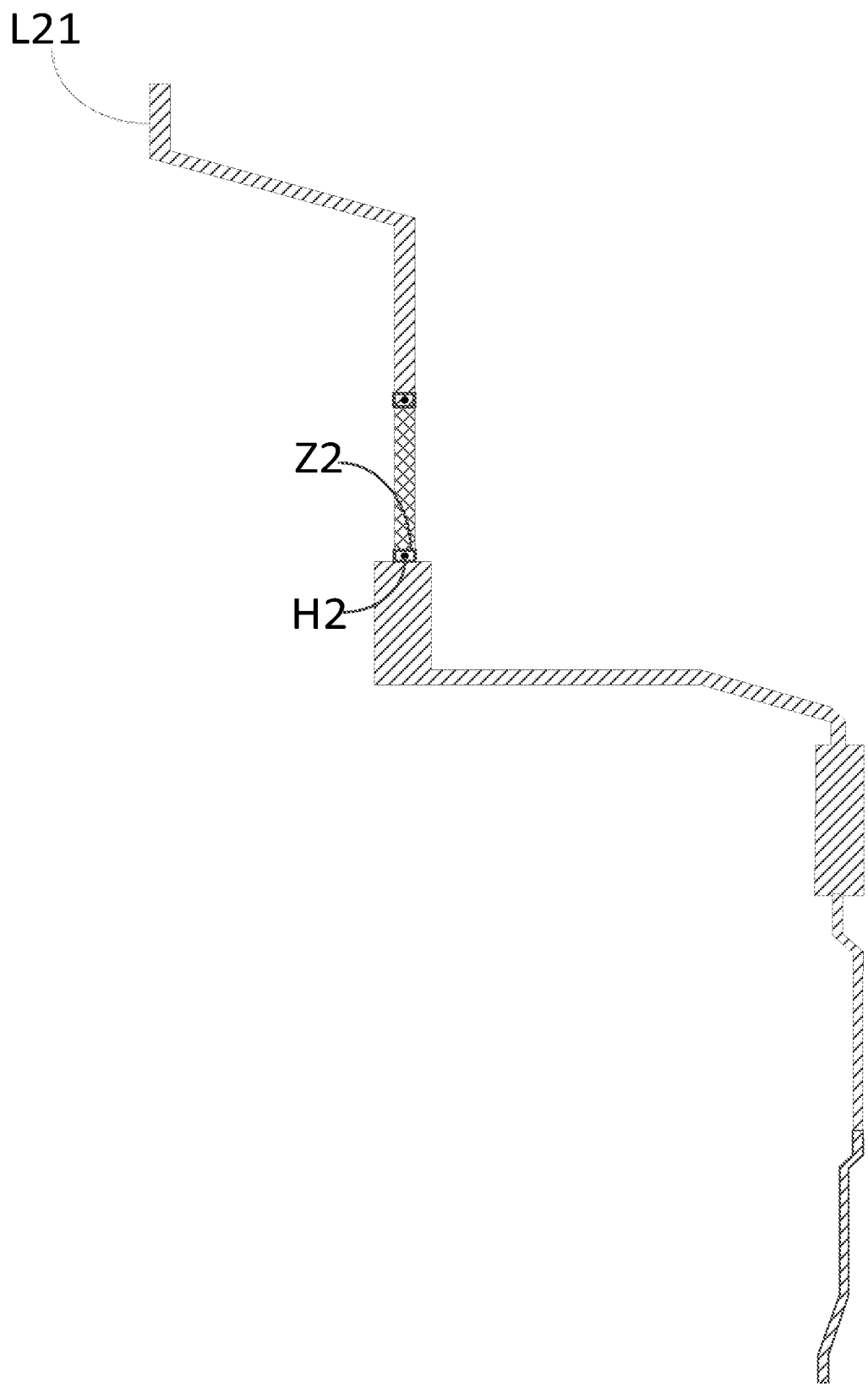
FIG. 18 is a schematic diagram of the part included in L21 and arranged in the second fan-out area F1 in FIG. 5 being coupled to the second transfer portion Z2 through a corresponding second via hole H2.

As shown in FIG. 18, the part included in L21 and arranged in the second fan-out area F1 is coupled to the second transfer portion Z2 through the corresponding second via hole H2, and the second transfer portion Z2 is coupled to the part included in L21 and arranged in the bending area B1.

In at least one embodiment of the present disclosure, since the second gate metal layer is not provided in the chip attaching area S1, in the third fan-out area F1, the part included in the data signal lead and arranged on the second gate metal layer is coupled to the third transfer portion, the third transfer portion may be included in the first gate metal layer, and the part included in the data signal lead and arranged in the second gate metal layer is coupled to the chip pins of the source driver of the chip attaching area S1 through the third transfer portion.

Figure 19:
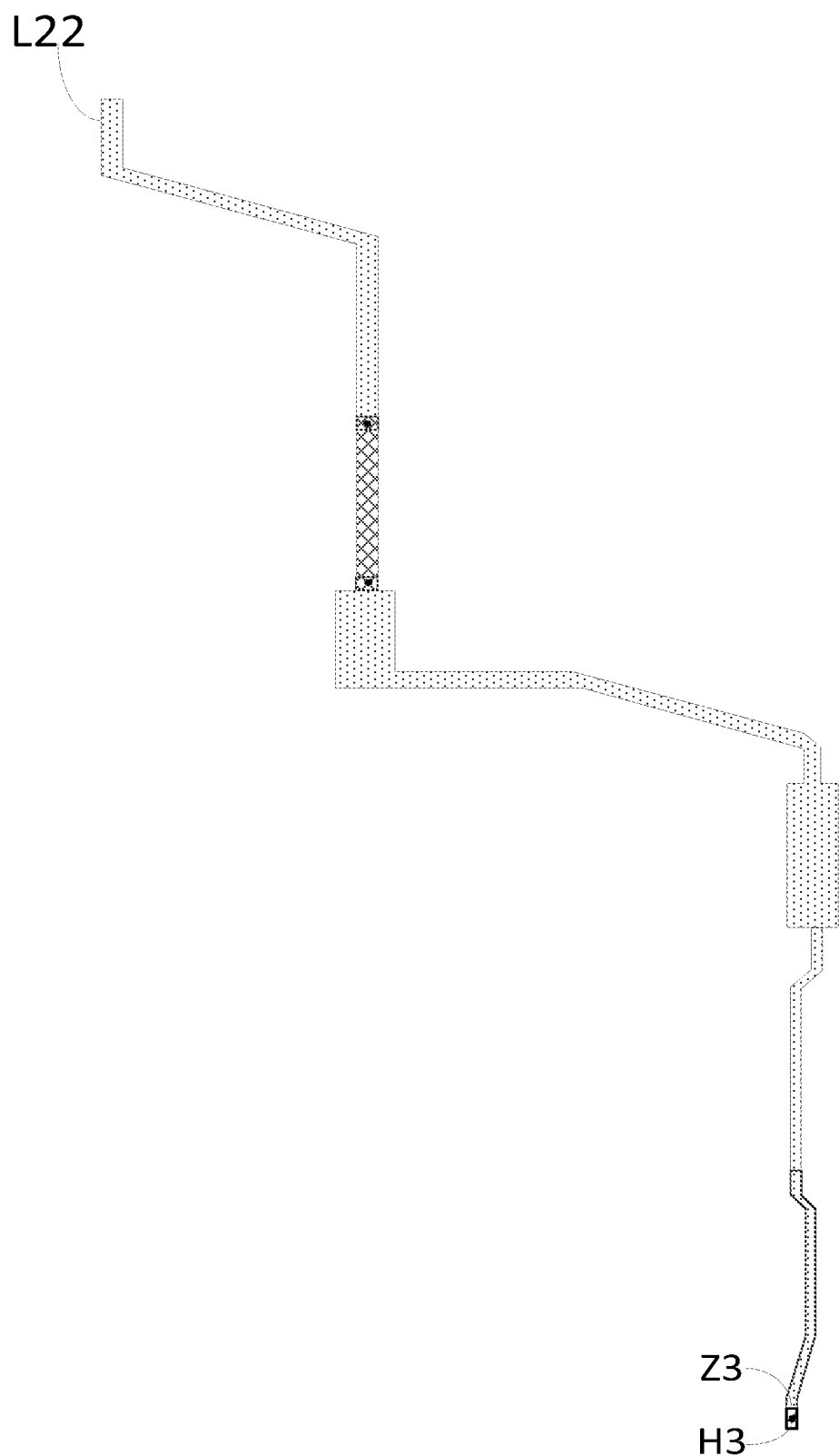
FIG. 19 is a schematic diagram of the part included in L22 and arranged in the chip attaching area S1 in FIG. 5 being coupled to the third transfer portion Z3 through a corresponding third via hole H3.

As shown in FIG. 19, the part included in L22 and arranged in the chip attaching area S1 is coupled to the third transfer portion Z3 through the corresponding third via hole H3, and the third transfer portion Z3 is included in the first gate metal layer.

The display device described in the embodiment of the present disclosure includes the above-mentioned display substrate.

In at least one embodiment of the present disclosure, the frame area of the display substrate may include a first fan-out area, a bending area, a second fan-out area, a third fan-out area and a chip attaching area that are arranged in a direction away from the display area, the display device includes a source driver attached to the chip attaching area;

The source driver is used to provide a data voltage, and provide the data voltage to the data line through the data signal lead.

In at least one embodiment of the present disclosure, the display device may be a folding display screen, but not limited thereto.

The display device provided by the embodiments of the present disclosure may be any product or component with a display function, such as a mobile phone, a tablet computer, a television, a monitor, a notebook computer, a digital photo frame, a navigator, and the like.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a display area, and a frame area arranged on a first side of the display area; wherein the display area includes a central display area, a first display area arranged on a second side of the central display area, and a second display area arranged on a third side of the central display area; the second side is opposite to the third side;

the display substrate includes a plurality of first data lines arranged in the central display area, a plurality of second data lines arranged in the first display area and the second display area, and a plurality of first data signal leads and a plurality of second data signal leads arranged in the frame area; the first data signal lead is coupled to the first data line, and the second data signal lead is coupled to the second data line;

the first data signal lead includes a first lead portion extending along a first direction, and the second data signal lead includes a second lead portion extending along a second direction;

a line width of the first lead portion is smaller than a line width of the second lead portion;

an extension direction of the first data line and an extension direction of the second data line are a third direction, the first direction intersects the third direction, and the second direction intersects the third direction;

there is a first angle between the first direction and the third direction, and there is a second angle between the second direction and the third direction.

2. The display substrate according to claim 1, wherein the line width of the first lead portion is greater than or equal to 1.0 um and less than or equal to 2.0 um, and the line width of the second lead portion is greater than or equal to 1.5 um and less than or equal to 3.0 um;

the second data signal lead further includes a third lead portion extending along a fourth direction;
a line width of the third lead portion is greater than the line width of the second lead portion.

3. The display substrate according to claim 2, wherein the line width of the third lead portion is greater than or equal to 1.8 um and less than or equal to 4.0 um;
the second data signal lead includes a fourth lead portion extending along a third direction;
a line width of the fourth lead portion is greater than the line width of the second lead portion.

4. The display substrate according to claim 3, wherein the line width of the fourth lead portion is greater than or equal to 3 um and less than or equal to 13 um;
the frame area includes a first fan-out area and a second fan-out area arranged along a direction away from the display area;
a line width of the second lead portion in the first fan-out area is smaller than a line width of the second lead portion in the second fan-out area.

5. The display substrate according to claim 4, wherein the first angle is greater than 0 degrees and less than 89.5 degrees, or greater than 90.5 degrees and less than 180 degrees, and the second angle is greater than 0 degrees and less than 89.5 degrees, or greater than 90.5 degrees and less than 180 degrees.

6. The display substrate according to claim 2, wherein the first angle is greater than 0 degrees and less than 89.5 degrees, or greater than 90.5 degrees and less than 180 degrees, and the second angle is greater than 0 degrees and less than 89.5 degrees, or greater than 90.5 degrees and less than 180 degrees.

7. The display substrate according to claim 3, wherein the first angle is greater than 0 degrees and less than 89.5 degrees, or greater than 90.5 degrees and less than 180 degrees, and the second angle is greater than 0 degrees and less than 89.5 degrees, or greater than 90.5 degrees and less than 180 degrees.

8. The display substrate according to claim 1, wherein the frame area comprises a first fan-out area and a second fan-out area arranged in a direction away from the display area; and the first data signal lead include a serpentine lead portion;
the serpentine lead portion includes a plurality of first lead portions extending along a third direction, and a plurality of second lead portions extending along a fifth direction; the first lead portions and the second lead portions are arranged alternately, adjacent first lead portion and the second lead portion are coupled to each other.

9. The display substrate according to claim 8, wherein a shortest distance between two adjacent second lead portions included in a same serpentine lead portion is greater than or equal to 2.4 um and less than or equal to 3 um; a shortest distance between adjacent two serpentine lead portions is greater than or equal to 1.0 um and less than or equal to 2 um, and the line width of the first lead portion and the line width of the second lead portion are both greater than or equal to 1.8 um and less than or equal to 2.4 um.

10. The display substrate according to claim 9, wherein the first angle is greater than 0 degrees and less than 89.5 degrees, or greater than 90.5 degrees and less than 180 degrees, and the second angle is greater than 0 degrees and less than 89.5 degrees, or greater than 90.5 degrees and less than 180 degrees.

11. The display substrate according to claim 8, wherein the first angle is greater than 0 degrees and less than 89.5 degrees, or greater than 90.5 degrees and less than 180 degrees, and the second angle is greater than 0 degrees and less than 89.5 degrees, or greater than 90.5 degrees and less than 180 degrees.

12. The display substrate according to claim 1, wherein the frame area includes a first fan-out area and a second fan-out area arranged along a direction away from the display area; in the first fan-out area, a sum of the line width of the first lead portion and a shortest distance between two adjacent first lead portions is equal to a sum of the line width of the second lead portion and a shortest distance between two adjacent second lead portions;
in the second fan-out area, the sum of the line width of the first lead portion and the shortest distance between two adjacent first lead portions is equal to the sum of the line width of the second lead portion and the shortest distance between two adjacent second lead portions.

13. The display substrate according to claim 12, wherein the shortest distance between two adjacent first lead portions is greater than or equal to 1.0 um and less than or equal to 2.0 um;
the shortest distance between two adjacent second lead portions is greater than or equal to 0.5 um and less than or equal to 1.0 um.

14. The display substrate according to claim 1, wherein the first angle is greater than 0 degrees and less than 89.5 degrees, or greater than 90.5 degrees and less than 180 degrees, and the second angle is greater than 0 degrees and less than 89.5 degrees, or greater than 90.5 degrees and less than 180 degrees.

15. The display substrate according to claim 1, wherein the frame area comprises a fan-out area, the fan-out area includes a first fan-out area and a second fan-out area arranged in a direction away from the display area;
the display substrate includes a base substrate, and a first metal layer and a second metal layer stacked along a direction away from the base substrate;
a lead portion included in the first data signal lead and arranged in the fan-out area is included in the first metal layer or the second metal layer;
a lead portion included in the second data signal lead and arranged in the fan-out area is included in the first metal layer or the second metal layer;
lead portions included in adjacent data signal leads and arranged in the fan-out area are included in different layers.

16. The display substrate according to claim 15, wherein the frame area further comprises a bending area arranged between the first fan-out area and the second fan-out area, and the display substrate further comprises a source-drain metal layer;
the data signal lead also includes a fifth lead portion arranged in the bending area; the fifth lead portion is included in the source-drain metal layer.

17. The display substrate according to claim 16, wherein the display substrate comprises a first source-drain metal layer and a second source-drain metal layer, and on a side of the second metal layer away from the base substrate, the first source-drain metal layer and the second source-drain metal layer are sequentially stacked in a direction away from the base substrate; the fifth lead portion is included in at least one of the first source-drain metal layer and the second source-drain metal layer.

18. The display substrate according to claim 16, wherein the display substrate comprises a first source-drain metal layer, a second source-drain metal layer and an additional source-drain metal layer; the fifth lead portion is included in at least one of the first source-drain metal layer, the second source-drain metal layer, and the additional source-drain metal layer;

on a side of the second metal layer away from the base substrate, the first source-drain metal layer, the second source-drain metal layer and the additional source-drain metal layer are sequentially stacked along a direction away from the base substrate; or, on the side of the second metal layer away from the base substrate, the additional source-drain metal layer, the first source-drain metal layer and the second source-drain metal layer are sequentially stacked in the direction away from the base substrate; or, the base substrate includes a first base substrate and a second base substrate that are stacked, and the additional source-drain metal layer is arranged between the first base substrate and the second base substrate, the first source-drain metal layer and the second source-drain metal layer are sequentially stacked on the side of the second metal layer away from the base substrate.

19. The display substrate according to claim 15, wherein the fan-out area further includes a third fan-out area, and the frame area further includes an electrostatic protection area and a cell-forming test area;

the second fan-out area, the electrostatic protection area, the cell-forming test area and the third fan-out area are arranged in sequence along a direction away from the display area;

a lead portion included in the first data signal lead and arranged in the electrostatic protection area and the cell-forming test area is arranged in a same layer as a lead portion included in the first data signal lead and arranged in the fan-out area;

a lead portion included in the second data signal lead and arranged in the electrostatic protection area and the cell-forming test area is arranged in a same layer as a lead portion included in the second data signal lead and arranged in the fan-out area.

20. A display device, comprising the display substrate according to claim 1.

* * * * *